United States Patent
Fox et al.

(10) Patent No.: US 9,371,226 B2
(45) Date of Patent: Jun. 21, 2016

(54) METHODS FOR FORMING PARTICLES

(75) Inventors: Robert V. Fox, Idaho Falls, ID (US);
Fengyan Zhang, Pocatello, ID (US);
Rene G. Rodriguez, Pocatello, ID (US);
Joshua J. Pak, Pocatello, ID (US);
Chivin Sun, Staten Island, NY (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 1042 days.

(21) Appl. No.: 13/019,879

(22) Filed: Feb. 2, 2011

(65) Prior Publication Data
US 2012/0192930 A1 Aug. 2, 2012

(51) Int. Cl.
| | |
|---|---|
| *H01L 31/02* | (2006.01) |
| *H01L 31/18* | (2006.01) |
| *C01B 17/00* | (2006.01) |
| *B82Y 30/00* | (2011.01) |
| *C01G 15/00* | (2006.01) |
| *H01L 31/032* | (2006.01) |

(Continued)

(52) U.S. Cl.
CPC .............. *B82Y 30/00* (2013.01); *C01G 15/006* (2013.01); *H01L 31/0322* (2013.01); *H01L 31/03923* (2013.01); *H01L 31/0749* (2013.01); *C01P 2002/72* (2013.01); *C01P 2002/84* (2013.01); *C01P 2004/62* (2013.01); *C01P 2004/64* (2013.01); *C01P 2006/40* (2013.01); *Y02E 10/541* (2013.01)

(58) Field of Classification Search
CPC .............. B82Y 30/00; H01L 31/0322; H01L 31/03923; H01L 31/0749; C01G 15/006; C01P 2002/40; C01P 2002/62; C01P 2002/64; C01P 2002/72; C01P 2002/84
USPC .............................. 423/511; 252/519; 438/95
See application file for complete search history.

(56) References Cited

U.S. PATENT DOCUMENTS

| | | | |
|---|---|---|---|
| 4,155,781 A | 5/1979 | Diepers | |
| 4,687,881 A | 8/1987 | Goslowsky et al. | |

(Continued)

FOREIGN PATENT DOCUMENTS

| | | |
|---|---|---|
| GB | 2472541 B | 3/2011 |
| WO | 2010-052221 | 5/2010 |

OTHER PUBLICATIONS

Le et al., "Solution synthesis of high-quality CuInS2 quantum dots as sensitizers for TiO2 photoelectrodes", Mar. 2010.*

(Continued)

*Primary Examiner* — Matthew Martin
(74) *Attorney, Agent, or Firm* — TraskBritt

(57) ABSTRACT

Single source precursors or pre-copolymers of single source precursors are subjected to microwave radiation to form particles of a I-III-VI$_2$ material. Such particles may be formed in a wurtzite phase and may be converted to a chalcopyrite phase by, for example, exposure to heat. The particles in the wurtzite phase may have a substantially hexagonal shape that enables stacking into ordered layers. The particles in the wurtzite phase may be mixed with particles in the chalcopyrite phase (i.e., chalcopyrite nanoparticles) that may fill voids within the ordered layers of the particles in the wurtzite phase thus produce films with good coverage. In some embodiments, the methods are used to form layers of semiconductor materials comprising a I-III-VI$_2$ material. Devices such as, for example, thin-film solar cells may be fabricated using such methods.

15 Claims, 8 Drawing Sheets

(51) Int. Cl.
*H01L 31/0392* (2006.01)
*H01L 31/0749* (2012.01)

(56) References Cited

U.S. PATENT DOCUMENTS

| | | | |
|---|---|---|---|
| 4,906,290 A | 3/1990 | Worner | |
| 5,445,847 A | 8/1995 | Wada et al. | |
| 5,501,786 A | 3/1996 | Gremion et al. | |
| 5,567,469 A | 10/1996 | Wada et al. | |
| 5,858,120 A | 1/1999 | Nakagawa et al. | |
| 6,127,202 A | 10/2000 | Kapur et al. | |
| 6,145,342 A | 11/2000 | Bayya et al. | |
| 6,284,314 B1 | 9/2001 | Kato et al. | |
| 6,307,148 B1 | 10/2001 | Takeuchi et al. | |
| 6,355,874 B1 | 3/2002 | Yagi et al. | |
| 6,429,369 B1 | 8/2002 | Tober et al. | |
| 6,592,938 B1 | 7/2003 | Pessey et al. | |
| 6,875,661 B2 | 4/2005 | Mitzi | |
| 6,992,201 B2 | 1/2006 | Scholz et al. | |
| 6,992,202 B1 * | 1/2006 | Banger et al. | 556/28 |
| 7,068,898 B2 | 6/2006 | Buretea et al. | |
| 7,265,037 B2 | 9/2007 | Yang et al. | |
| 7,351,282 B2 | 4/2008 | Yamaguchi | |
| 7,466,376 B2 | 12/2008 | Galvin et al. | |
| 7,545,051 B2 | 6/2009 | Yang et al. | |
| 7,575,699 B2 | 8/2009 | Strouse et al. | |
| 7,615,169 B2 | 11/2009 | Strouse | |
| 7,883,799 B2 | 2/2011 | Seo et al. | |
| 7,892,519 B2 | 2/2011 | Pak et al. | |
| 2002/0005145 A1 | 1/2002 | Sherman | |
| 2002/0071970 A1 | 6/2002 | Elder et al. | |
| 2003/0226498 A1 | 12/2003 | Alivisatos et al. | |
| 2004/0031519 A1 | 2/2004 | Andriessen | |
| 2004/0095658 A1 | 5/2004 | Buretea et al. | |
| 2004/0120884 A1 | 6/2004 | Sherman | |
| 2004/0126485 A1 | 7/2004 | Thompson et al. | |
| 2004/0131934 A1 | 7/2004 | Sugnaux et al. | |
| 2004/0256001 A1 | 12/2004 | Mitra et al. | |
| 2005/0016577 A1 | 1/2005 | Andriessen et al. | |
| 2005/0133087 A1 | 6/2005 | Alivisatos et al. | |
| 2005/0183767 A1 | 8/2005 | Yu et al. | |
| 2005/0267345 A1 | 12/2005 | Korgel et al. | |
| 2005/0271827 A1 | 12/2005 | Krunks et al. | |
| 2006/0110314 A1 | 5/2006 | Torardi | |
| 2006/0110315 A1 | 5/2006 | Torardi | |
| 2006/0110316 A1 | 5/2006 | Torardi | |
| 2006/0110317 A1 | 5/2006 | Torardi | |
| 2006/0110318 A1 | 5/2006 | Torardi | |
| 2006/0144793 A1 | 7/2006 | Dadachov | |
| 2006/0159611 A1 | 7/2006 | Hummelen et al. | |
| 2006/0216610 A1 | 9/2006 | Galvin et al. | |
| 2006/0249373 A1 | 11/2006 | Vanderstraeten | |
| 2006/0263291 A1 | 11/2006 | Torardi | |
| 2007/0000537 A1 | 1/2007 | Leidholm et al. | |
| 2007/0025139 A1 | 2/2007 | Parsons | |
| 2007/0102040 A1 | 5/2007 | Beckenbaugh et al. | |
| 2007/0128350 A1 | 6/2007 | Nakamura et al. | |
| 2007/0204904 A1 | 9/2007 | Brooks et al. | |
| 2007/0209700 A1 | 9/2007 | Yonezawa et al. | |
| 2007/0277871 A1 | 12/2007 | Lee et al. | |
| 2007/0295385 A1 | 12/2007 | Sheats et al. | |
| 2008/0006322 A1 | 1/2008 | Wang et al. | |
| 2008/0006324 A1 | 1/2008 | Berke et al. | |
| 2008/0012015 A1 | 1/2008 | Shim et al. | |
| 2008/0023677 A1 | 1/2008 | Frechet et al. | |
| 2008/0026929 A1 | 1/2008 | Jensen et al. | |
| 2008/0031832 A1 | 2/2008 | Wakefield et al. | |
| 2008/0041447 A1 | 2/2008 | Tseng et al. | |
| 2008/0110494 A1 | 5/2008 | Reddy | |
| 2008/0142075 A1 | 6/2008 | Reddy et al. | |
| 2008/0149171 A1 | 6/2008 | Lu et al. | |
| 2008/0156371 A1 | 7/2008 | LoCascio et al. | |
| 2008/0207581 A1 | 8/2008 | Whiteford et al. | |
| 2008/0230120 A1 | 9/2008 | Reddy | |
| 2008/0289681 A1 | 11/2008 | Adriani et al. | |
| 2008/0289682 A1 | 11/2008 | Adriani et al. | |
| 2008/0308148 A1 | 12/2008 | Leidholm et al. | |
| 2009/0050207 A1 | 2/2009 | Galvin et al. | |
| 2009/0133751 A1 | 5/2009 | Sreenivasan et al. | |
| 2009/0173371 A1 | 7/2009 | Skoczenski et al. | |
| 2009/0233398 A1 | 9/2009 | Fox et al. | |
| 2011/0027572 A1 | 2/2011 | Wiesner | |
| 2011/0152554 A1 | 6/2011 | Fox et al. | |
| 2011/0204320 A1 | 8/2011 | Fox et al. | |
| 2012/0061627 A1 | 3/2012 | Reiss et al. | |
| 2012/0108418 A1 | 5/2012 | Nair et al. | |

OTHER PUBLICATIONS

Banger et al., "A review of single source precursors for the deposition of ternary chalcopyrite materials," NASA Conference Publication (2002), 17th Space Photovoltaic Research and Technology Conference, 2001, pp. 115-125.

Connor et al., "Phase Transformation of Biphasic CuS#CuInS to Monophasic CuInS Nanorods," J. Am. Chem. Soc, 2009, 131 (13), 4962-4966.

Deniozou et al., "Surface structure of CuGASe2 (001)" Thin Solid Films 480-481 (2005) 382-387.

Gardner et al., "Rapid synthesis and size control of CuInS2 semiconductor nanoparticles using microwave irradiation," J. Nanoparticle Research 2008, 10(4), pp. 633-641.

Halgand et al., "Physico-chemical characterisation of Cu(In,Al)Se2 thin film for solar cells obtained by a selenisation process," Thin Solid Films 480-481 (2005) 443-446.

Hirpo et al., J. Am. Chem. Soc. 1993, vol. 115, pp. 1597-1599.

Jin et al., "Solar cells fabricated with CuInS2 films deposited using single-source precursors," Proceedings of the 19th European Photovoltaic Solar Energy Conference, 4AV.1.71, 2004.

Liu et al., "Preparation and characterization of CuInS2 thin films completely converted from CuInSe2 by sulfurization," Thin Solid Films 480-481 (2005) 50-54.

Nairn et al., "Preparation of Ultrafine Chalcopyrite Nanoparticles via the Photochemical Decomposition of Molecular Single-Source Precursors," Nano Letters 2006, vol. 6(6), pp. 1218-1223.

Narako et al., "Synthesis of Metastable Wurtzite CuInSe2Nanocrystals," Chem. Mater. 2010, 22, 1613-1615.

Pan et al., "Synthesis of Cu—In—S Ternary Nanocrystals with Tunable Structure and Composition," J. Am. Chem. Soc. Apr. 30, 2008; 130(17):5620-1, Epub Apr. 9, 2008.

PCT International Search Report and Written Opinion of the International Searching Authority for PCT/US09/36221, dated Nov. 2, 2009, 11 pages.

Qi et al., "Synthesis and Characterization of Nanostructured Wurtzite CuInS2: A New Cation Disordered Polymorph of CuInS2," J. Phys. Chem. C 2009, 113, 3939-3944.

Rodrigues, et al., "Pulsed-Spray Radiofrequency Plasma Enhanced Chemical Vapor Deposition of CUInS2 Thin Films," Plasma Chemistry and Plasma Processing, vol. 26, No. 2, Apr. 2006 , pp. 137-148.

Rodriguez et al., "The Formation of Copper Indium Disulfide Nano-Particles in Supercritical Carbon Dioxide," NORM 2007, American Chemical Society, The 62nd Northwest Regional Meeting, Boise, Idaho, Jun. 17-20, 2007, 5 pages.

Sun et al., "A High-Yield Synthesis of Chalcopyrite CuInS2 Nanoparticles with Exceptional Size Control," Journal of Nanomaterials, vol. 2009, Article ID 748567, 7 pages.

Wang et al., "Synthesis of Monodispersed Wurtzite Structure CuInSe2 Nanocrystals and Their Application in High-Performance Organic-Inorganic Hybrid Photodetectors," J. Am. Chem. Soc., 2010, 132 (35), pp. 12218-12221.

Banger et al., "Ternary single-source precursors for polycrystalline thin-film solar cells," Appl. Organomet. Chem. (2002) 16:617-627.

Deivaraj et al., "Novel bimetallic thiocarboxylate compounds as single-source precursors to binary and ternary metal sulfide materials," Chem. Mater. (2003) 15:2383-2391.

Deivaraj et al., "Single-source precursors to ternary silver indium sulfide materials," Chem. Commun. (2001) 2304-2305.

Malik et al., "A novel route for the preparation of CuSe and CuInSe2 nanoparticles," Advanced Materials, (1999) 11:1441-1444.

(56) References Cited

OTHER PUBLICATIONS

Vittal et al., "Chemistry of metal thio- and selenocarboxylates: precursors for metal sulfide/selenide materials, thin films, and nanocrystals," Acc. Chem. Res. (2006) 39:869-877.

PCT International Search Report and Written Opinion of the International Searching Authority for PCT/US10/60583, dated Mar. 21, 2011, 12 pages.

Bamba et al., "TiO2—ZnO Porous Films Formed by ZnO Dissolution," AZojomo, vol. 3, Dec. 2007, 7 pages.

De Faria, et al., "Sol-Gel TiO2 Thin Films Sensitized with the Mulberry Pigment Cyanidin," Materials Research, vol. 10, No. 4, 413-417, 2007.

Hamid et al., "Preparation of Titanium Dioxide (TiO2) thin films by sol gel dip coating method," Malaysian Journal of Chemistry, 2003, vol. 5, No. 1, pp. 086-091.

Hirashima et al., "Preparation of meso-porous TiO2 gels and their characterization," Journal of Non-Crystalline Solids 285 (2001) pp. 96-100.

Miki et al., "Influence of calcination temperature on the microstructure of pourous TiO2 film," Materials Science Forum, vol. 569 (2008) pp. 17-20.

Paez et al., "Properties of Sol-Gel TiO2 Layers on Glass Substrate," Ceramics—Silikáty 48 (2) pp. 66-71 (2004).

PCT International Preliminary Report on Patentability for International Searching Authority for PCT/US09/36221, dated Sep. 14, 2010, 8 pages.

Sayilkan et al., "Characterization of TiO2 Synthesized in Alcohol by a Sol-Gel Process: The Effects of Annealing Temperature and Acid Catalyst," Turk J Chem, 29 (2005) pp. 697-706.

Bahnemann, D. W., "Ultrasmall Metal Oxide Particles: Preparation, Photophysical Characterization, and Photocatalytic Properties". Israel J. Chem., 1993, pp. 115-136, vol. 33.

Banger, K.K., et al., "Synthesis and Characterization of the First Liquid Ssingle-Source Precursors for the Deposition of Ternary Chalcopyrite (CuInS(2)) Thin Film Materials," Chem. Mater., 2001, pp. 3827-3829, vol. 13.

Banger, K.K., et al., "Facile modulation of single source precursors: the synthesis and characterization of single source precursors for deposition of ternary chalcopyrite materials," Thin Solid Films, 2002, pp. 390-395, vol. 403-404.

Banger, K.K., et al., "A New Facile Route for the Preparation of Single-Source Precursors for Bulk, Thin-Film, and Nanocrystallite I-III-VI Semiconductors," Inorg. Chem., 2003, pp. 7713-7715, vol. 42, No. 24.

Cardellicchio, N., et al., "Optimization of Microwave Digestion for Mercury Determination in Marine Biological Samples by Cold Vapour Atomic Absorption Spectrometry", Annali di Chimica, 2006, pp. 159-165, vol. 96 (3-4).

Carro, N., et al., "Microwave-assisted solvent extraction and gas chromatography ion trap mass spectrometry procedure for the determination of persistent organochlorine pesticides (POPs) in marine sediment", Anal. Bioanal. Chem., 2006, pp. 901-909, vol. 385.

Castro, S.L., et al., "Nanocrystalline Chalcopyrite Materials (CuInS(2)), and CuInSe(2)) via Low-Temperature Pyrolysis of Molecular Single-Source Precursors", Chem. Mater., 2003, pp. 3142-3147, vol. 15.

Castro, S.L., et al., "Synthesis and Characterization of Colloidal CuInS(2) Nanoparticles from a Molecular Single-Source Precursor," J Phys Chem B., 2004, pp. 12429-12435, vol. 108.

Choi, S.H., et al., "One-Pot Synthesis of Copper—Indium, Sulfide Nanocrystal Heterostructures with Acorn, Bottle, and Larva Shapes," J. Am Chem Soc., 2006, pp. 2520-2521, vol. 128 (8).

Domini, C.E, et al., "Comparison of three optimized digestion methods for rapid determination of chemical oxygen demand: Closed microwaves, open microwaves and ultrasound irradiation," Analytica Chimica Acta., 2006, pp. 210-217, vol. 561.

Dutta, D.P., et al., "A facile route to the synthesis of CuInS(2) nanoparticles," Materials Letters, 2006, pp. 2395-2398, vol. 60.

Gamallo-Lorenzo, D., et al., "Microwave-assisted alkaline digestion combined with microwave-assisted distillation for the determination of iodide and total iodine in edible seaweed by catalytic spectrophotometry," Analytica Chimica Acta., 2005, pp. 287-295, vol. 542.

Garcia-Vidal, J.A., et al., "Green chemistry: Efficient epoxides ring-opening with l-butanol under microwave irradiation," Applied Surface Science, 2006, pp. 6064-6066, vol. 252 (17).

Gratzel, M., "Perspectives for Dye-sensitized Nanocrystalline Solar Cells," Progress in Photovoltaics: Research and Applications, 2000, pp. 171-185, vol. 8.

Grisaru, H, et al., "Microwave-Assisted Polyol Synthesis of CuInTe(2) and CuInSe(2) Nanoparticles," Inorg. Chem., 2003, pp. 7148-7155, vol. 42.

Hayes, B.L., "Recent Advances in Microwave-Assisted Synthesis," Aldrichimica Acta., 2004, pp. 66-77, vol. 37 No. 2.

Huynh, W.U., et al., "CdSe Nanocrystal Rods/Poly (3-hexylthiophene) Composite Photovoltaic Devices," Advanced Materials, 1999, pp. 923-927, vol. 11 No. 11.

Huynh, W.U., et al., "Hybrid Nanorod-Polymer Solar Cells," Science, 2002, pp. 2425-2427, vol. 295.

Luque, A., et al., "Increasing the Efficiency of Ideal Solar Cells by Photon Induced Transitions at Intermediate Levels," Physical Review Letters, 1997, pp. 5014-5017, vol. 78 No. 26.

Marcinkevicius, S., et al., "Changes in carrier dynamics induced by proton irradiation in quantum dots," Physica. B, Condensed Matter, 2002, pp. 203-206, vol. 314.

Murali, A., et al., Synthesis and Characterization of Indium Oxide Nanoparticles, Nano Letters, 2001, pp. 287-289, vol. 1, No. 6.

Navarro, P., et al., "Optimisation of microwave assisted digestion of sediments and determination of Sn and Hg," Analytica Chimica Acta, 2006, pp. 37-44, vol. 566.

Nüchter, M., et al., "Microwave-Assisted Chemical Reactions," Chem. Eng. Technol., 2003, 1207-1216, vol. 26 (12).

Nüchter, M., et al., "Microwave Assisted Synthesis—a critical technology overview," Green Chem., 2004, pp. 128-141, vol. 6 (3).

Pak, J.J., et al., "An efficient synthesis of 4, 4' ,5,5'-tetraiododibenzo-24-crown-8 and its highly conjugated derivatives," Tetrahedron Letters, 2005, pp. 233-237, vol. 47.

Perozo-Rondon, E., et al., "Microwave enhanced synthesis of N-propargyl derivatives of imidazole a green approach for the preparation of fungicidal compounds," Applied Surface Science, 2006, pp. 6067-6070, vol. 252 (17).

Sobolev, N.A., et al., "Enhanced Radiation Hardness of InAs/GaAs quantum Dot Structures," Phys. Stat. Sol. (B), 2001, pp. 93-96, vol. 224, No. 1.

Tang, Z., et al., "Semiconductor Nanoparticles on Solid Substrates: Film Structure, Intermolecular Interactions, and Polyelectrolyte Effects," Langmuir, 2002, pp. 7035-7740, vol. 18.

Walters, R.J., et al., "Radiation Hard Multi-quantum Well InP/InAsP Solar Cells for Space Applications,"Progress in Photovoltaics: Research and Applications, 2000, pp. 349-354, vol. 8.

Wang, Y., et al., "Nanometer-Sized Semiconductor Clusters: Materials Synthesis, Quantum Size Effects, and Photophysical Properties," J. Phys. Chem., 1991, pp. 525-532, vol. 95.

Wei, Q., et al., "Synthesis of CuInS(2) Nanocubes by a Wet Chemical Process," Journal of Dispersion Science and Technology, 2005, pp. 555-558, vol. 26.

Zhang, X., et al., "Applications of microwave dielectric heating in environment-related heterogeneous gas-phase catalytic systems," Inorganica Chimica Acta, 2006, pp. 3421-3433, vol. 359.

Zhu, J., et al., "Microwave assisted preparation of CdSe, PbSe, andCU2-x Se nanoparticles," J. Phys. Chem. B., 2000, 104 (31), 7344-7347.

Tomalia, D.A., "Birth of a New Macromolecular Architecture: Dendrimers as Quantized Building Blocks for Nanoscale Synthetic Organic Chemistry," Aldrichimica ACTA, 2004, pp. 39-57, vol. 27, No. 2.

Gerbec, J.A., et al., "Microwave-Enhanced Reaction Rates for Nanoparticle Synthesis," J. Am. Chem. Soc., 2005, pp. 15791-15800, vol. 127.

Kim, K., et al., "Synthesis of CuInSe(2) and CuInGaSe(2) Nanoparticles by Solvothermal Route," Materials Science Forum, 2004, pp. 273-276, vols. 449-452.

* cited by examiner

METHODS FOR FORMING PARTICLES

GOVERNMENT RIGHTS

This Invention was made under a Cooperative Research and Development Agreement between Precision Nanoparticles PNP, LLC and Battelle Energy Alliance, LLC under Contract No. DEAC05ID14517, awarded by the U.S. Department of Energy. The U.S. Government has certain rights in the invention.

CROSS-REFERENCE TO RELATED APPLICATION

This application is related to U.S. patent application Ser. No. 12/047,956 to Fox et al., entitled "METHODS FOR FORMING PARTICLES FROM SINGLE SOURCE PRECURSORS, METHODS OF FORMING SEMICONDUCTOR DEVICES, AND DEVICES FORMED USING SUCH METHODS," which was filed on Mar. 13, 2008, now U.S. Pat. No. 8,003,070, issued Aug. 23, 2011, the disclosure of which is incorporated by reference herein in its entirety.

TECHNICAL FIELD

Embodiments of the invention relate to methods of forming particles of I-III-VI$_2$ material in a wurtzite and/or chalcopyrite phase, methods of forming semiconductor materials from such particles and to methods of forming devices that include such semiconductor materials.

BACKGROUND

Photovoltaic devices function by converting radiation absorbed from sunlight into electrical power through photon absorption by semiconductor materials that exhibit the photovoltaic effect. Solar cells include photovoltaic devices that convert sunlight (i.e., photons originating from the sun) into electricity. The growing demand for renewable energy resources continues to drive development of cost-effective and high-efficiency photovoltaic cells for use in solar cells and arrays of photovoltaic devices.

Solar cells can be broadly classified into types that include silicon solar cells, thin-film solar cells and compound solar cells. A so-called "thin-film solar cell" (TFSC), also referred to as a "thin-film photovoltaic cell" (TFPV), is a solar cell that is made by depositing one or more thin layers (i.e., thin films) of photovoltaic material on a substrate. The photovoltaic materials used in TFSCs may be produced in a variety of crystalline and non-crystalline forms. Although the crystalline materials have exhibited high conversion efficiencies, the cost of production may prohibit widespread use in TFSCs.

Several crystalline materials have been increasingly studied for use in fabrication of the TFSCs due to their potential for stability, reliability and performance. For example, chalcopyrites (e.g., $CuInS_2$, $CuGaS_2$, and $CuInSe_2$) have band gaps that correlate well to the solar spectrum, have large absorption coefficients and good photostability and, thus, have great potential for use in the TFSCs.

To improve efficiency of the TFSCs, it is important to form the chalcopyrites having desired material properties. Various techniques are known in the art for depositing the chalcopyrites on substrates, such as co-evaporation, sputtering, sulfurization, ion plating and chemical processes. It has been shown that crystal structure and size may affect the optoelectronic properties of chalcopyrites and, thus, the performance of the TFSCs including such materials. Furthermore, intrinsic defects in the chalcopyrites may affect electrical, optical and structural properties.

Methods for forming photovoltaic devices using chalcopyrite nanoparticles have been disclosed. The photovoltaic devices formed by such methods include one or more layers of a photovoltaic material formed from the chalcopyrite nanoparticles. To obtain a photovoltaic material having a desired particle (i.e., grain) size, a two-part annealing process is performed—the first part promoting adhesion of the chalcopyrite nanoparticles and the second part converting the chalcopyrite nanoparticles to a unitary chalcopyrite structure. The ability to form a chalcopyrite material having a dense structure and a large grain size would represent a significant improvement in the development of photovoltaic devices.

BRIEF SUMMARY

In some embodiments, the present invention includes methods of forming particles. The method may include decomposing at least one single source precursor in the presence of at least one thiol and forming a plurality of particles from one or more products of the decomposition of the at least one single source precursor.

The method of forming particles may also include reacting at least one single source precursor with a thiol to form a pre-copolymer of the at least one single source precursor, decomposing the pre-copolymer of the single source precursor and forming a plurality of particles from one or more decomposition products of the pre-copolymer of the single source precursor.

In further embodiments, the present invention includes methods of forming semiconductor materials, the methods including forming particles comprising a I-III-VI$_2$ material in a wurtzite phase, combining the particles with a liquid to form a particle matrix, depositing the particle matrix over at least a portion of a substrate and annealing the particles to convert the I-III-VI$_2$ material in the wurtzite phase to a chalcopyrite phase.

In yet further embodiments, the present invention includes methods for forming semiconductor devices. Such methods may include forming particles of a I-III-VI$_2$ material in a wurtzite phase over a first conductive material overlying a substrate, performing an annealing process to convert the particles of the I-III-VI$_2$ material in the wurtzite phase to a chalcopyrite phase forming a semiconductor material and forming a second conductive material over the semiconductor material.

In additional embodiments, the present invention includes devices such as, for example, semiconductor devices that include particles and/or material layers formed using embodiments of methods of the present invention, or that are otherwise fabricated using embodiments of methods of the present invention, as described herein.

BRIEF DESCRIPTION OF THE DRAWINGS

While the specification concludes with claims particularly pointing out and distinctly claiming that which is regarded as the present invention, advantages of this invention may be more readily ascertained from the following description of the invention when read in conjunction with the accompanying drawings in which:

DETAILED DESCRIPTION

Figure 1:
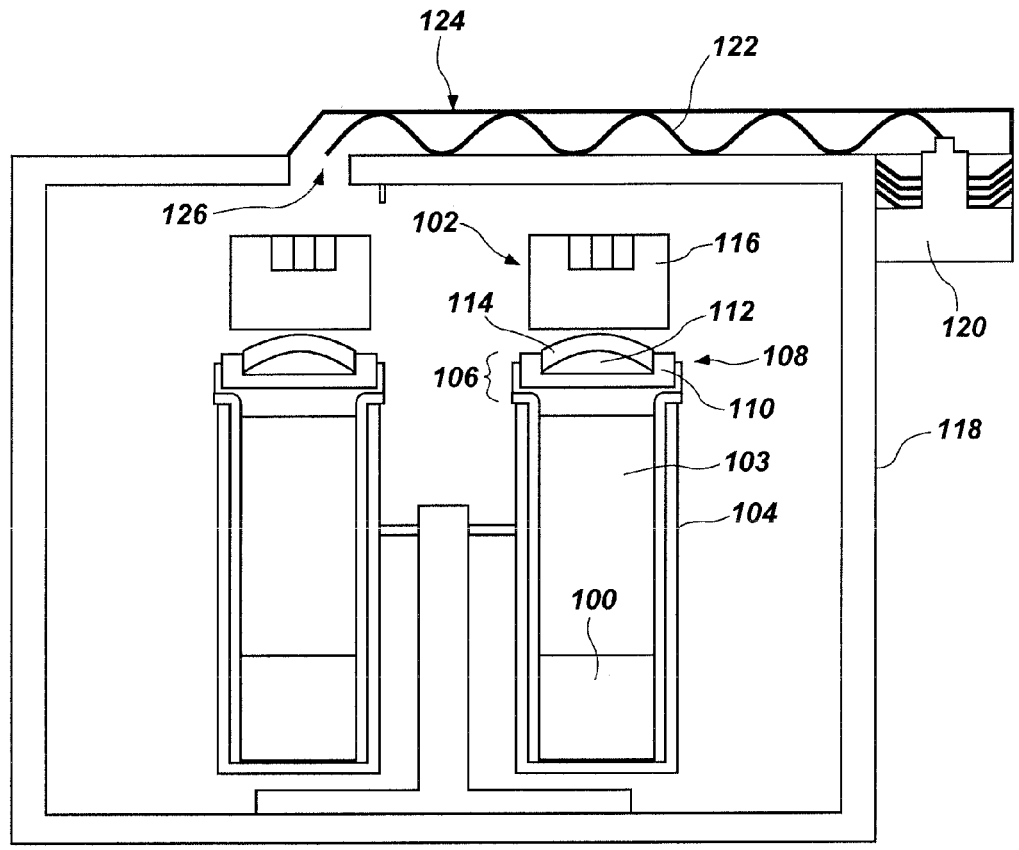
FIG. 1 is a simplified partial cross-sectional view of a portion of an embodiment of a system of the present invention that may be used to form particles of material in accordance with embodiments of methods of the present invention.

Methods of forming particles from single source precursors or from pre-copolymers of single source precursors, methods of forming semiconductor materials from such particles, and methods of forming semiconductor devices that include such semiconductor materials disposed between a conductor and an insulator are disclosed. The semiconductor devices include, for example, thin-film solar cells, sensors, filters and detectors of electromagnetic radiation or nuclear radiation.

As used herein, the term "I-III-$VI_2$ material" means and includes any compound generally represented by the formula I-III-$VI_2$, wherein I represents an element in Group I (Groups IA (1) and IB (11)) of the periodic table; wherein III refers to an element in Group III (Groups IIIB (3) and IIIA (13)) of the periodic table; and wherein VI refers to an element in Group VI (Groups VIB (6) and VIA (16)) of the periodic table. For example, the I-III-$VI_2$ material may be generally have the formula $(Cu, Ag)(Al, Ga, In, Tl, Fe)(S, Se, Te)_2$. For example, approximately twenty-five percent (25%) of the atoms in a ternary chalcopyrite material may be from Group IB, approximately twenty-five percent (25%) of the atoms may be from Group IIIA, and approximately fifty percent (50%) of the atoms may be from Group VIA. $CuInS_2$, $CuInSe_2$, $CuIn_xGa_{(1-x)}Se_2$, $CuGaSe_2$, $CuIn_xGa_{(1-x)}S_2$, $CuFeS_2$, $AgGaS_2$, $AgGaSe_2$, and $AgInS_2$ are examples of I-III-$VI_2$ compounds. It should be noted that I-III-$VI_2$ compounds include compounds having multiple and/or different atoms from each of three Groups of the periodic table. For example, the I-III-$VI_2$ compound CuInSSe includes Cu (Group IB), In (Group IIIA), and S and Se (both from Group VIA). In addition, materials of the form (Cu:Ag)(In:Ga)(S:Se), having various ratios of the respectively grouped atoms are all I-III-$VI_2$ compounds (Cu and Ag are both in Group IB, In and Ga both are in Group IIIA, S and Se are both in Group VIA). The I-III-$VI_2$ material may be in a wurtzite phase or a chalcopyrite phase, or may include a mixture of wurtzite and chalcopyrite phase, as will be described in further detail.

As used herein, the term "wurtzite phase" means and includes a state in which a material exhibits a crystal lattice structure that includes a hexagonal close packed array of anions with cations occupying half of the tetrahedral holes.

As used herein, the term "chalcopyrite phase" means and includes a state in which a material exhibits a crystal lattice structure that includes a tetrahedrally coordinated, ordered structure.

As used herein, the term "single source precursor" means and includes any molecule or complex that comprises all of the atomic elements, in the appropriate stoichiometric ratios, for forming a I-III-$VI_2$ material. Single source precursors may comprise so-called organometallic substances. As non-limiting examples, single source precursors include molecules or complexes having the empirical formula $[\{L\}_nM'(ER)_x(X)_y(R)_zM'']$, wherein x is 1-4, x+y+z=4, L is a Lewis base that is coordinated to M' by a dative bond, n is greater than or equal to 1, M' is a Group I-B atom, M'' is a Group IIIA atom, E is a Group VIA atom, X is a group VIIA atom, and each R is individually selected from the group consisting of alkyl, aryl, vinyl, (per)fluoro alkyl, (per)fluoro aryl, silane, and carbamato groups. As one particular non-limiting example, $(Ph_3P)_2Cu(\mu\text{-}SEt)_2In(SEt)_2$, $(Ph_3P)_2CuIn(SePh)_2(SEt)_2$ and $(Ph_3P)_2Cu(\mu\text{-}SEt)_2Ga(SEt)_2$ are single source precursors.

Embodiments of the present invention include methods of forming I-III-$VI_2$ particles in the wurtzite phase and/or the chalcopyrite phase and are believed to generally reduce reaction times, improve product purity, enable the use of many forms of single source precursors and/or pre-(co)polymer of single source precursors, and provide good reproducibility and high yields relative to other methods known in the art.

Referring to FIG. 1, a reaction mixture 100 including the single source precursors, the thiol, such as a dithiol or a thiol acid, may be provided within a vessel 102, or another form of container. As a non-limiting example, the single source precursors may be provided in the vessel 102 and may be dissolved in the solvent, such as benzyl acetate, to form a solution. The thiol may then be added to the solution comprising the single source precursors dissolved in the solvent to form the reaction mixture 100. As another non-limiting example, the single source precursors may be dissolved in a thiol. For example, the vessel 102 may comprise any enclosure or container having an interior region or cavity 103 for holding pressurized fluids (e.g., liquids, gases, and supercritical fluids). As a non-limiting example, the vessel 102 may comprise a housing 104 and a lid 106, which may be secured to an upper rim of the housing 104 to close the vessel 102, as shown in FIG. 1. Although not shown, one or more seals (e.g., O-rings) may be used to provide a fluid-tight seal between the housing 104 and the lid 106. The vessel 102 may be formed from a chemically inert material that is transparent to microwave radiation, such as a plastic or polymer.

The vessel 102 may include a valve 108 for opening upon application of a predetermined amount of pressure within the vessel 102 so that internal pressure within the vessel 102 may be released to reduce the internal pressure during heating. An insert 110 having a disc shape may be inserted into a recess 112 in the lid 106. The diameter of the insert 110 may substantially correspond to an external diameter of the housing 104.

A spring 114 formed from an elastic material may be inserted into the recess 112 on the lid 106. The spring 114 may be formed from a hard or viscoelastic plastic, such as a polyetherimide (PEI) or a polyether-ether-ketone (PEEK). The elasticity of the spring 114 enables the valve 108 to be stressed by a predetermined amount. The spring 114 may be located on an exterior surface of the housing 104 to enable cooled air to circulate thereover. The spring 114 may be held in place within the insert 110 in the lid 106 by a biasing device 116, which may be affixed to a vertical shaft (not shown).

The vessel 102 containing the reaction mixture 100 may be disposed in a heating appliance, such as microwave chamber 120. The microwave chamber 120 may be equipped with one or more magnetrons 118 for generating microwave radiation. The microwave chamber 120 may also be equipped with a diffuser (not shown) for homogeneous distribution of the microwave radiation within the microwave chamber 120. The microwave radiation (which is illustrated by line 122) may be passed through a wave guide 124 and into the microwave chamber 120 via port 126.

Within the microwave chamber 120, the reaction mixture 100 may be heated to a temperature of between less than about 360° C. and, more particularly, between about 60° C. and about 360° C. For example, the reaction mixture 100 may be heated by irradiating the reaction mixture 100 contained within the vessel 102 with microwave radiation generated by the microwave 120. The microwave radiation generated by the microwave 120 may homogenously heat the reaction mixture 100 providing consistent decomposition and reaction of the single source precursors.

As the reaction mixture 100 is heated, the single source precursors decompose in the presence of the thiol, such as the dithiol or the thiol acid, which may act as a stabilizing ligand. In embodiments where the thiol comprises a thiol acid, such as 3-mercaptopropionic acid, the thiol acid together with metal ions from the single source precursor may complex on surfaces of the single source precursors. While not wishing to be bound by any particular theory, it is believed that the thiol may be more strongly complexed to surfaces of the single source precursors than to other free ions in the reaction mixture 100. Such complexation may result in the formation of a passivation shell around the single source precursors enabling decomposition of the single source precursors into the I-III-VI$_2$ particles. In embodiments where the thiol comprises a dithiol, such as 1,2-ethanedithiol, the dithiol may bond to two or more single source precursors acting as a bridging unit or cross-linking agent between the single source precursors to form a pre-copolymer of the single source precursors. While not wishing to be bound by any particular theory, it is believed that the dithiol may react with the single source precursors to form highly cross-linked oligomeric structures which may undergo rapid decomposition to produce the I-III-VI$_2$ particles.

The reaction mixture 100 may be heated, for example, for between about 10 minutes and about 4 hours and, more particularly, for about 1 hour.

During formation of the I-III-VI$_2$ particles, the temperature to which the reaction mixture 100 is heated may be controlled to form a desired ratio of wurtzite particles to chalcopyrite particles. In embodiments in which the I-III-VI$_2$ particles comprise chalcopyrite particles, the reaction mixture 100 may be exposed to temperatures of between about 60° C. and about 360° C. to form a plurality of the I-III-VI$_2$ particles in the chalcopyrite phase. In embodiments in which the I-III-VI$_2$ particles comprise a mixture of chalcopyrite particles and wurtzite particles, the reaction mixture 100 may be exposed to temperatures of between about 120° C. and about 300° C. to form a mixture of the I-III-VI$_2$ particles in the wurtzite phase and in the chalcopyrite phase. In embodiments in which the I-III-VI$_2$ particles comprise wurtzite particles, the reaction mixture 100 may be exposed to temperatures greater than about 120° C. to form a plurality of the I-III-VI$_2$ particles in the wurtzite phase.

An amount of the thiol added to the reaction mixture 100 may also be controlled to form the desired ratio of wurtzite particles to chalcopyrite particles. For example, to form quaternary CuIn$_x$Ga$_{1-x}$S$_2$ particles in the wurtzite phase, the thiol acid (e.g., 3-mercaptopropionic acid) may be combined with the solution of the single source precursors dissolved in the solvent in the vessel 102 to form the reaction mixture 100, and the reaction mixture 100 may be exposed to microwave radiation at a temperature of between about 120° C. and about 300° C. The quaternary CuIn$_x$Ga$_{1-x}$S$_2$ particles may additionally be formed in the chalcopyrite phase by adding a dithiol, such as 1,2-ethanedithiol, to the reaction mixture 100. For example, one molar equivalent of 1,2-ethanedithiol may be added to the reaction mixture 100 including 3-mercaptopropionic acid, the single source precursors and the solvent to form the quaternary CuIn$_x$Ga$_{1-x}$S$_2$ particles in the wurtzite phase. Increasing the amount of the dithiol, such as 1,2-ethanedithiol, in the reaction may result in increased formation of chalcopyrite particles. In this way, the thiol reactants may be controlled to form the desired ratio of wurtzite to chalcopyrite particles.

As the reaction mixture 100 is heated within the vessel 102, a mixing mechanism or device (not shown) may, optionally, be used to enhance mixing of the single source precursors with the thiol acid. For example, the mixing mechanism or device may comprise a magnetic stir rod, which may be rotated within the reaction mixture 100. In other embodiments, however, a mixing mechanism or device may not be used. After irradiating the reaction mixture 100 for a period of time, the single source precursors may decompose to form particles of multinary (e.g., ternary or quaternary) I-III-VI$_2$ material in a wurtzite phase and/or a chalcopyrite phase. The exact length of time required to form the particles of ternary or quaternary I-III-VI$_2$ material may depend upon one or more of the composition of the single source precursors, the composition of the thiol(s), and the reaction temperature and pressure, and the extent of mixing provided.

By way of example and not limitation, the following are examples of dithiols that may be used in the preparation of the I-III-VI$_2$ particles: 1,2-ethanedithiol, 1,1-methanedithiol, phenyl-1,2-ethanedithiol, 1,3-propanedithiol, 2,2-propanedithiol, 1,2,-propanedithiol, 2,2-dimethyl-1,3-propanedithiol, 2-see-butyl-2-methyl-1,3-propanedithiol, 1,3-diphenyl-2,2-propanedithiol, 1,4-butanedithiol, 2,3-butanedithiol, 2,2-butanedithiol, 1,3-isobutanedithiol, 1,5-pentanedithiol, 1,6-hexanedithiol, 1,2-hexanedithiol, 2-ethyl-1,6-hexanedithiol, 2,5-dimethyl-3,4-hexanedithiol, 2,5-dimethyl-2,4-hexanedithiol, 2-ethyl-1,3-hexanedithiol, 3,5,5,-trimethyl-1,1-hexanedithiol, 1,7-heptanedithiol, 1,8-octanedithiol, 1,2-octanedithiol, 2,6-dimethyl-3,7-octanedithiol, 2,6-dimethyl-2,6-octanedithiol, 1,9-nonanedithiol, 1,10-decanedithiol, 1,12-dodecanedithiol, 1,2-diphenyl-1,2-ethanedithiol, 7,8-pentadecanedithiol, 1,10-octadecanedithiol, 1,12-octadecanedithiol, 1,2-hexadecanedithiol, 1,2-octadecanedithiol, 1,18-octadecanedithiol, 1,11-undecanedithiol and 12,12-tricosanedithiol.

By way of example and not limitation, the following are examples of thiol acids that may be used in the preparation of the I-III-VI$_2$ particles: 3-mercaptopropionic acid, dialkyl dithiophosphoric acid, alkane thiols, mercaptopropionic acid, mercaptoethanol, thioglycolic acid, thiol acetic acid, thiolactic acid, ammonium thioglycolate, mercaptoacetic acid, dithiothreitol, thiophenol, 2-mercapto-4-methyl-5-thiazoleacetic acid, 11-mercaptoundecanoic acid, 11-mercaptoundecylphosphoric acid, N—[(S)-3-mercapto-2-methylpropionyl]-L-proline, DL-penicillamine, N-acetyl-D-penicillamine, (2Z)-3-(4-iodophenyl)-2-mercapto-2-propenoic acid, (2-mercapto-1,3-thiazol-4-yl)acetic acid, 2-mercapto-3-(2-nitrophenyl)acrylic acid, 4-mercaptobenzoic acid, 3-mercaptobenzoic acid and thiosalicylic acid.

By way of example and not limitation, the following are examples of copper-indium SSPs: [bis(ethanethiolato)indium]bis[μ-(ethanethiolato)]bis(triisobutylphosphine)-copper; [bis(ethanethiolato)indium]bis[μ-(ethanethiolato)]bis(trihexylphosphine)-copper; [bis(ethanethiolato)indium]bis[μ-(ethanethiolato)]bis(triphenylphosphine)-copper; [bis(ethanethiolato)indium]bis[μ-(ethanethiolato)]bis(perfluorotriphenylphosphine)-copper; [bis(propanethiolato)indium]bis[μ-(propanethiolato)]bis(triisobutylphosphine)-copper; [bis(propanethiolato)indium]bis[μ-(propanethiolato)]bis(trihexylphosphine)-copper; [bis(propanethiolato)indium]bis[μ-(propanethiolato)]bis(triphenylphosphine)-copper; [bis(propanethiolato)indium]bis[μ-(propanethiolato)]bis(perfluorotriphenylphosphine)-copper; [bis(hexanethiolato)indium]bis[μ-(propanethiolato)]bis(triisobutylphosphine)-copper; [bis(hexanethiolato)indium]bis[μ-(propanethiolato)]bis(trihexylphosphine)-copper; [bis(hexanethiolato)indium]bis[μ-(propanethiolato)]bis(triphenylphosphine)-copper; [bis(hexanethiolato)indium]bis[μ-(propanethiolato)]bis(perfluorotriphenylphosphine)-copper; [bis(4-trifluoromethyl-thiophenolato)indium]bis[μ-(4-trifluoromethylthiophenolato)]bis(triisobutylphosphine)-copper; [bis(4-trifluoromethyl-thiophenolato)indium]bis[μ-(4-trifluoromethyl-thiophenolato)]bis(trihexylphosphine)-copper; [bis(4-trifluoromethyl-thiophenolato)indium]bis[μ-(4-trifluoromethyl-thiophenolato)]bis(triphenylphosphine)-copper; [bis(4-trifluoromethyl-thiophenolato)indium]bis[μ-(4-trifluoromethyl-thiophenolato)]bis(perfluorotriphenylphosphine)-copper; [bis(3,5-bis(trifluoromethyl)-thiophenolato)indium]bis[μ-(3,5-bis(trifluoromethyl)-thiophenolato)]bis(triisobutylphosphine)-copper; [bis(3,5-bis(trifluoromethyl)-thiophenolato)indium]bis[μ-(3,5-bis(trifluoromethyl)-thiophenolato bis(trihexylphosphine)-copper; [bis(3,5-bis(trifluoromethyl)-thiophenolato)indium]bis[μ-(3,5-bis(trifluoromethyl)-thiophenolato)]bis(triphenylphosphine)-copper; [bis(3,5-bis(trifluoromethyl)-thiophenolato)indium]bis[μ-(3,5-bis(trifluoromethyl)-thiophenolato)]bis(perfluorotriphenylphosphine)-copper; [bis(thiophenolato)indium]bis[μ-(thiophenolato)]bis(triisobutylphosphine)-copper; [bis(thiophenolato)indium]bis[μ-(thiophenolato)]bis(trihexylphosphine)-copper; [bis(thiophenolato)indium]bis[μ-(thiophenolato)]bis(triphenylphosphine)-copper; [bis(thiophenolato)indium]bis[μ-(thiophenolato)]bis(perfluorotriphenylphosphine)-copper; [bis(α-toluenethiolato)indium]bis[μ-(α-toluenethiolato)]bis(triisobutylphosphine)-copper; [bis(α-toluenethiolato)indium]bis[μ-(α-toluenethiolato)]bis(trihexylphosphine)-copper; [bis(α-toluenethiolato)indium]bis[μ-(α-toluenethiolato)]bis(triphenylphosphine)-copper; [bis(α-toluenethiolato)indium]bis[μ-(α-toluenethiolato)]bis(perfluorotriphenylphosphine)-copper; [bis(pentafluorothiophenolato)indium]bis[μ-(pentafluorothiophenolato)]bis(triisobutylphosphine)-copper; [bis(pentafluorothiophenolato)indium]bis[μ-(pentafluorothiophenolato)]bis(trihexylphosphine)-copper; [bis(pentafluorothiophenolato)indium]bis[μ-(pentafluorothiophenolato)]bis(triphenylphosphine)-copper; [bis(pentafluorothiophenolato)indium]bis[μ-(pentafluorothiophenolato)]bis(perfluorotriphenylphosphine)-copper; [bis(thiobenzoato)indium]bis[μ-(thiobenzoato)]bis(triisobutylphosphine)-copper; [bis(thiobenzoato)indium]bis[μ-(thiobenzoato)]bis(trihexylphosphine)-copper; [bis(thiobenzoato)indium]bis[μ-(thiobenzoato)]bis(triphenylphosphine)-copper; [bis(thiobenzoato)indium]bis[μ-(thiobenzoato)]bis(perfluorotriphenylphosphine)-copper; [bis(thiobenzoato)indium]bis[μ-(thiobenzoato)]bis[ethylenebis(diphenylphosphine)]-copper; [bis(thiobenzoato)indium]bis[μ-(thiobenzoato)]bis[bis(2-diphenylphosphinophenyl)ether]-copper; [bis(thiobenzoato)indium]bis[μ-(thiobenzoato)]bis(trimethylphosphine)-copper; [bis(ethanethiolato)indium]bis[μ-(ethanethiolato)]bis[ethylenebis(diphenylphosphine)]-copper; [bis(ethanethiolato)indium]bis[μ-(ethanethiolato)]bis[bis(2-diphenylphosphinophenyl)ether]-copper; [bis(ethanethiolato)indium]bis[μ-(thiophenolato)]bis(triphenylphosphine)-copper; and [bis(ethanethiolato)indium]bis[μ-(ethanethiolato)]bis(trimethylphosphine)-copper.

By way of example and not limitation, the following are examples of copper-gallium SSPs: [bis(ethanethiolato)Gallium]bis[μ-(ethanethiolato)]bis(triisobutylphosphine)-copper; [bis(ethanethiolato)Gallium]bis[μ-(ethanethiolato)]bis(trihexylphosphine)-copper; [bis(ethanethiolato)Gallium]bis[μ-(ethanethiolato)]bis(triphenylphosphine)-copper; [bis(ethanethiolato)Gallium]bis[μ-(ethanethiolato)]bis(perfluorotriphenylphosphine)-copper; [bis(propanethiolato)Gallium]bis[μ-(propanethiolato)]bis(triisobutylphosphine)-copper; [bis(propanethiolato)Gallium]bis[μ-(propanethiolato)]bis(trihexylphosphine)-copper; [bis(propanethiolato)Gallium]bis[μ-(propanethiolato)]bis(triphenylphosphine)-copper; [bis(propanethiolato)Gallium]bis[μ-(propanethiolato)]bis(perfluorotriphenylphosphine)-copper; [bis(hexanethiolato)Gallium]bis[μ-(propanethiolato)]bis(triisobutylphosphine)-copper; [bis(hexanethiolato)Gallium]bis[μ-(propanethiolato)]bis(trihexylphosphine)-copper; [bis(hexanethiolato)Gallium]bis[μ-(propanethiolato)]bis(triphenylphosphine)-copper; [bis(hexanethiolato)Gallium]bis[μ-(propanethiolato)]bis(perfluorotriphenylphosphine)-copper; [bis(4-trifluoromethyl-thiophenolato)Gallium]bis[μ-(4-trifluoromethyl-thiophenolato)]bis(triisobutylphosphine)-copper; [bis(4-trifluoromethyl-thiophenolato)Gallium]bis[μ-(4-trifluoromethyl-thiophenolato)]bis(trihexylphosphine)-copper; [bis(4-trifluoromethyl-thiophenolato)Gallium]bis[μ-(4-trifluoromethyl-thiophenolato)]bis(triphenylphosphine)-copper; [bis(4-trifluoromethyl-thiophenolato)Gallium]bis[μ-(4-trifluoromethyl-thiophenolato)]bis(perfluorotriphenylphosphine)-copper; [bis(3,5-bis(trifluoromethyl)-thiophenolato)Gallium]bis[μ-(3,5-bis(trifluoromethyl)-thiophenolato)]bis(triisobutylphosphine)-copper; [bis(3,5-bis(trifluoromethyl)-thiophenolato)Gallium]bis[μ-(3,5-bis(trifluoromethyl)-thiophenolato bis(trihexylphosphine)-copper; [bis(3,5-bis(trifluoromethyl)-thiophenolato)Gallium]bis[μ-(3,5-bis(trifluoromethyl)-thiophenolato)]bis(triphenylphosphine)-copper; [bis(3,5-bis(trifluoromethyl)-thiophenolato)Gallium]bis[μ-(3,5-bis(trifluoromethyl)-thiophenolato)]bis(perfluorotriphenylphosphine)-copper; [bis(thiophenolato)

gallium]bis[μ-(thiophenolato)]bis(triisobutylphosphine)-copper; [bis(thiophenolato)gallium]bis[μ-(thiophenolato)]bis(trihexylphosphine)-copper; [bis(thiophenolato)gallium]bis[μ-(thiophenolato)]bis(triphenylphosphine)-copper; [bis(thiophenolato)gallium]bis[μ-(thiophenolato)]bis(perfluorotriphenylphosphine)-copper; [bis(α-toluenethiolato)gallium]bis[μ-(α-toluenethiolato)]bis(triisobutylphosphine)-copper; [bis(α-toluenethiolato)gallium]bis[μ-(α-toluenethiolato)]bis(trihexylphosphine)-copper; [bis(α-toluenethiolato)gallium]bis[μ-(α-toluenethiolato)]bis(triphenylphosphine)-copper; [bis(α-toluenethiolato)gallium]bis[μ-(α-toluenethiolato)]bis(perfluorotriphenylphosphine)-copper; [bis(pentafluorothiophenolato)gallium]bis[μ-(pentafluorothiophenolato)]bis(triisobutylphosphine)-copper; [bis(pentafluorothiophenolato)gallium]bis[μ-(pentafluorothiophenolato)]bis(trihexylphosphine)-copper; [bis(pentafluorothiophenolato)gallium]bis[μ-(pentafluorothiophenolato)]bis(triphenylphosphine)-copper; and [bis(pentafluorothiophenolato)gallium]bis[μ-(pentafluorothiophenolato)]bis(perfluorotriphenylphosphine)-copper.

By way of example and not limitation, the following are examples of silver-indium SSPs: [bis(ethanethiolato)indium]bis[μ-(ethanethiolato)]bis(triisobutylphosphine)-silver; [bis(ethanethiolato)indium]bis[μ-(ethanethiolato)]bis(trihexylphosphine)-silver; [bis(ethanethiolato)indium]bis[μ-(ethanethiolato)]bis(triphenylphosphine)-silver; [bis(ethanethiolato)indium]bis[μ-(ethanethiolato)]bis(perfluorotriphenylphosphine)-silver; [bis(propanethiolato)indium]bis[μ-(propanethiolato)]bis(triisobutylphosphine)-silver; [bis(propanethiolato)indium]bis[μ-(propanethiolato)]bis(trihexylphosphine)-silver; [bis(propanethiolato)indium]bis[μ-(propanethiolato)]bis(triphenylphosphine)-silver; [bis(propanethiolato)indium]bis[μ-(propanethiolato)]bis(perfluorotriphenylphosphine)-silver; [bis(hexanethiolato)indium]bis[μ-(propanethiolato)]bis(triisobutylphosphine)-silver; [bis(hexanethiolato)indium]bis[μ-(propanethiolato)]bis(trihexylphosphine)-silver; [bis(hexanethiolato)indium]bis[μ-(propanethiolato)]bis(triphenylphosphine)-silver; [bis(hexanethiolato)indium]bis[μ-(propanethiolato)]bis(perfluorotriphenylphosphine)-silver; [bis(4-trifluoromethyl-thiophenolato)indium]bis[μ-(4-trifluoromethyl-thiophenolato)]bis(triisobutylphosphine)-silver; [bis(4-trifluoromethyl-thiophenolato)indium]bis[μ-(4-trifluoromethyl-thiophenolato)]bis(trihexylphosphine)-silver; [bis(4-trifluoromethyl-thiophenolato)indium]bis[μ-(4-trifluoromethyl-thiophenolato)]bis(triphenylphosphine)-silver; [bis(4-trifluoromethyl-thiophenolato)indium]bis[μ-(4-trifluoromethyl-thiophenolato)]bis(perfluorotriphenylphosphine)-silver; [bis(3,5-bis(trifluoromethyl)-thiophenolato)indium]bis[μ-(3,5-bis(trifluoromethyl)-thiophenolato)]bis(triisobutylphosphine)-silver; [bis(3,5-bis(trifluoromethyl)-thiophenolato)indium]bis[μ-(3,5-bis(trifluoromethyl)-thiophenolato bis(trihexylphosphine)-silver; [bis(3,5-bis(trifluoromethyl)-thiophenolato)indium]bis[μ-(3,5-bis(trifluoromethyl)-thiophenolato)]bis(triphenylphosphine)-silver; and [bis(3,5-bis(trifluoromethyl)-thiophenolato)indium]bis[μ-(3,5-bis(trifluoromethyl)-thiophenolato)]bis(perfluorotriphenylphosphine)-silver.

By way of example and not limitation, the following are examples of silver-gallium SSPs: [bis(ethanethiolato)gallium]bis[μ-(ethanethiolato)]bis(triisobutylphosphine)-silver; [bis(ethanethiolato)gallium]bis[μ-(ethanethiolato)]bis(trihexylphosphine)-silver; [bis(ethanethiolato)gallium]bis[μ-(ethanethiolato)]bis(triphenylphosphine)-silver; [bis(ethanethiolato)gallium]bis[μ-(ethanethiolato)]bis(perfluorotriphenylphosphine)-silver; [bis(propanethiolato)gallium]bis[μ-(propanethiolato)]bis(triisobutylphosphine)-silver; [bis(propanethiolato)gallium]bis[μ-(propanethiolato)]bis(trihexylphosphine)-silver; [bis(propanethiolato)gallium]bis[μ-(propanethiolato)]bis(triphenylphosphine)-silver; [bis(propanethiolato)gallium]bis[μ-(propanethiolato)]bis(perfluorotriphenylphosphine)-silver; [bis(hexanethiolato)gallium]bis[μ-(propanethiolato)]bis(triisobutylphosphine)-silver; [bis(hexanethiolato)gallium]bis[μ-(propanethiolato)]bis(trihexylphosphine)-silver; [bis(hexanethiolato)gallium]bis[μ-(propanethiolato)]bis(triphenylphosphine)-silver; [bis(hexanethiolato)gallium]bis[μ-(propanethiolato)]bis(perfluorotriphenylphosphine)-silver; [bis(4-trifluoromethyl-thiophenolato)gallium]bis[μ-(4-trifluoromethyl-thiophenolato)]bis(triisobutylphosphine)-silver; [bis(4-trifluoromethyl-thiophenolato)gallium]bis[μ-(4-trifluoromethyl-thiophenolato)]bis(trihexylphosphine)-silver; [bis(4-trifluoromethyl-thiophenolato)gallium]bis[μ-(4-trifluoromethyl-thiophenolato)]bis(triphenylphosphine)-silver; [bis(4-trifluoromethyl-thiophenolato)gallium]bis[μ-(4-trifluoromethyl-thiophenolato)]bis(perfluorotriphenylphosphine)-silver; [bis(3,5-bis(trifluoromethyl)-thiophenolato)gallium]bis[μ-(3,5-bis(trifluoromethyl)-thiophenolato)]bis(triisobutylphosphine)-silver; [bis(3,5-bis(trifluoromethyl)-thiophenolato)gallium]bis[μ-(3,5-bis(trifluoromethyl)-thiophenolato)]bis(trihexylphosphine)-silver; [bis(3,5-bis(trifluoromethyl)-thiophenolato)gallium]bis[μ-(3,5-bis(trifluoromethyl)-thiophenolato)]bis(triphenylphosphine)-silver; [bis(3,5-bis(trifluoromethyl)-thiophenolato)gallium]bis[μ-(3,5-bis(trifluoromethyl)-thiophenolato)]bis(perfluorotriphenylphosphine)-silver; [bis(thiophenolato)gallium]bis[μ-(thiophenolato)]bis(triisobutylphosphine)-silver; [bis(thiophenolato)gallium]bis[μ-(thiophenolato)]bis(trihexylphosphine)-silver; [bis(thiophenolato)gallium]bis[μ-(thiophenolato)]bis(triphenylphosphine)-silver; [bis(thiophenolato)gallium]bis[μ-(thiophenolato)]bis(perfluorotriphenylphosphine)-silver; [bis(α-toluenethiolato)gallium]bis[μ-(α-toluenethiolato)]bis(triisobutylphosphine)-silver; [bis(α-toluenethiolato)gallium]bis[μ-(α-toluenethiolato)]bis(trihexylphosphine)-silver; [bis(α-toluenethiolato)gallium]bis[μ-(α-toluenethiolato)]bis(triphenylphosphine)-silver; [bis(α-toluenethiolato)gallium]bis[μ-(α-toluenethiolato)]bis(perfluorotriphenylphosphine)-silver; [bis(pentafluorothiophenolato)gallium]bis[μ-(pentafluorothiophenolato)]bis(triisobutylphosphine)-silver; [bis(pentafluorothiophenolato)gallium]bis[μ-(pentafluorothiophenolato)]bis(trihexylphosphine)-silver; [bis(pentafluorothiophenolato)gallium]bis[μ-(pentafluorothiophenolato)]bis(triphenylphosphine)-silver; and [bis(pentafluorothiophenolato)gallium]bis[μ-(pentafluorothiophenolato)]bis(perfluorotriphenylphosphine)-silver.

By way of example and not limitation, the following are examples of copper-aluminum SSPs: [bis(ethanethiolato)aluminum]bis[μ-(ethanethiolato)]bis(triisobutylphosphine)-copper; [bis(ethanethiolato)aluminum]bis[μ-(ethanethiolato)]bis(trihexylphosphine)-copper; [bis(ethanethiolato)aluminum]bis[μ-(ethanethiolato)]bis(triphenylphosphine)-copper; [bis(ethanethiolato)aluminum]bis[μ-(ethanethiolato)]bis(perfluorotriphenylphosphine)-copper; [bis(propanethiolato)aluminum]bis[μ-(propanethiolato)]bis(triisobutylphosphine)-copper; [bis(propanethiolato)aluminum]bis[μ-(propanethiolato)]bis(trihexylphosphine)-copper; [bis(propanethiolato)aluminum]bis[μ-

(propanethiolato)]bis(triphenylphosphine)-copper; [bis(propanethiolato)aluminum]bis[μ-(propanethiolato)]bis(perfluorotriphenylphosphine)-copper; [bis(hexanethiolato)aluminum]bis[μ-(propanethiolato)]bis(triisobutylphosphine)-copper; [bis(hexanethiolato)aluminum]bis[μ-(propanethiolato)]bis(trihexylphosphine)-copper; [bis(hexanethiolato)aluminum]bis[μ-(propanethiolato)]bis(triphenylphosphine)-copper; [bis(hexanethiolato)aluminum]bis[μ-(propanethiolato)]bis(perfluorotriphenylphosphine)-copper; [bis(4-trifluoromethyl-thiophenolato)aluminum]bis[μ-(4-trifluoromethylthiophenolato)]bis(triisobutylphosphine)-copper; [bis(4-trifluoromethyl-thiophenolato)aluminum]bis[μ-(4-trifluoromethyl-thiophenolato)]bis(trihexylphosphine)-copper; [bis(4-trifluoromethyl-thiophenolato)aluminum]bis[μ-(4-trifluoromethyl-thiophenolato)]bis(triphenylphosphine)-copper; [bis(4-trifluoromethyl-thiophenolato)aluminum]bis[μ-(4-trifluoromethyl-thiophenolato)]bis(perfluorotriphenylphosphine)-copper; [bis(3,5-bis(trifluoromethyl)-thiophenolato)aluminum]bis[μ-(3,5-bis(trifluoromethyl)-thiophenolato)]bis(triisobutylphosphine)-copper; [bis(3,5-bis(trifluoromethyl)-thiophenolato)aluminum]bis[μ-(3,5-bis(trifluoromethyl)-thiophenolato)]bis(trihexylphosphine)-copper; [bis(3,5-bis(trifluoromethyl)-thiophenolato)aluminum]bis[μ-(3,5-bis(trifluoromethyl)-thiophenolato)]bis(triphenylphosphine)-copper; [bis(3,5-bis(trifluoromethyl)-thiophenolato)aluminum]bis[μ-(3,5-bis(trifluoromethyl)-thiophenolato)]bis(perfluorotriphenylphosphine)-copper; [bis(thiophenolato)aluminum]bis[μ-(thiophenolato)]bis(triisobutylphosphine)-copper; [bis(thiophenolato)aluminum]bis[μ-(thiophenolato)]bis(trihexylphosphine)-copper; [bis(thiophenolato)aluminum]bis[μ-(thiophenolato)]bis(triphenylphosphine)-copper; [bis(thiophenolato)aluminum]bis[μ-(thiophenolato)]bis(perfluorotriphenylphosphine)-copper; [bis(α-toluenethiolato)aluminum]bis[μ-(α-toluenethiolato)]bis(triisobutylphosphine)-copper; [bis(α-toluenethiolato)aluminum]bis[μ-(α-toluenethiolato)]bis(trihexylphosphine)-copper; [bis(α-toluenethiolato)aluminum]bis[μ-(α-toluenethiolato)]bis(triphenylphosphine)-copper; [bis(α-toluenethiolato)aluminum]bis[μ-(α-toluenethiolato)]bis(perfluorotriphenylphosphine)-copper; [bis(pentafluorothiophenolato)aluminum]bis[μ-(pentafluorothiophenolato)]bis(triisobutylphosphine)-copper; [bis(pentafluorothiophenolato)aluminum]bis[μ-(pentafluorothiophenolato)]bis(trihexylphosphine)-copper; [bis(pentafluorothiophenolato)aluminum]bis[μ-(pentafluorothiophenolato)]bis(triphenylphosphine)-copper; and [bis(pentafluorothiophenolato)aluminum]bis[μ-(pentafluorothiophenolato)]bis(perfluorotriphenylphosphine)-copper.

By way of example and not limitation, the following are examples of silver-aluminum SSPs: [bis(ethanethiolato)aluminum]bis[μ-(ethanethiolato)]bis(triisobutylphosphine)-silver; [bis(ethanethiolato)aluminum]bis[μ-(ethanethiolato)]bis(trihexylphosphine)-silver; [bis(ethanethiolato)aluminum]bis[μ-(ethanethiolato)]bis(triphenylphosphine)-silver; [bis(ethanethiolato)aluminum]bis[μ-(ethanethiolato)]bis(perfluorotriphenylphosphine)-silver; [bis(propanethiolato)aluminum]bis[μ-(propanethiolato)]bis(triisobutylphosphine)-silver; [bis(propanethiolato)aluminum]bis[μ-(propanethiolato)]bis(trihexylphosphine)-silver; [bis(propanethiolato)aluminum]bis[μ-(propanethiolato)]bis(triphenylphosphine)-silver; [bis(propanethiolato)aluminum]bis[μ-(propanethiolato)]bis(perfluorotriphenylphosphine)-silver; [bis(hexanethiolato)aluminum]bis[μ-(propanethiolato)]bis(triisobutylphosphine)-silver; [bis(hexanethiolato)aluminum]bis[μ-(propanethiolato)]bis(trihexylphosphine)-silver; [bis(hexanethiolato)aluminum]bis[μ-(propanethiolato)]bis(triphenylphosphine)-silver; [bis(hexanethiolato)aluminum]bis[μ-(propanethiolato)]bis(perfluorotriphenylphosphine)-silver; [bis(4-trifluoromethyl-thiophenolato)aluminum]bis[μ-(4-trifluoromethylthiophenolato)]bis(triisobutylphosphine)-silver; [bis(4-trifluoromethyl-thiophenolato)aluminum]bis[μ-(4-trifluoromethyl-thiophenolato)]bis(trihexylphosphine)-silver; [bis(4-trifluoromethyl-thiophenolato)aluminum]bis[μ-(4-trifluoromethyl-thiophenolato)]bis(triphenylphosphine)-silver; [bis(4-trifluoromethyl-thiophenolato)aluminum]bis[μ-(4-trifluoromethyl-thiophenolato)]bis(perfluorotriphenylphosphine)-silver; [bis(3,5-bis(trifluoromethyl)-thiophenolato)aluminum]bis[μ-(3,5-bis(trifluoromethyl)-thiophenolato)]bis(triisobutylphosphine)-silver; [bis(3,5-bis(trifluoromethyl)-thiophenolato)aluminum]bis[μ-(3,5-bis(trifluoromethyl)-thiophenolatobis(trihexylphosphine)-silver; [bis(3,5-bis(trifluoromethyl)-thiophenolato)aluminum]bis[μ-(3,5-bis(trifluoromethyl)-thiophenolato)]bis(triphenylphosphine)-silver; [bis(3,5-bis(trifluoromethyl)-thiophenolato)aluminum]bis[μ-(3,5-bis(trifluoromethyl)-thiophenolato)]bis(perfluorotriphenylphosphine)-silver; [bis(thiophenolato)aluminum]bis[μ-(thiophenolato)]bis(triisobutylphosphine)-silver; [bis(thiophenolato)aluminum]bis[μ-(thiophenolato)]bis(trihexylphosphine)-silver; [bis(thiophenolato)aluminum]bis[μ-(thiophenolato)]bis(triphenylphosphine)-silver; [bis(thiophenolato)aluminum]bis[μ-(thiophenolato)]bis(perfluorotriphenylphosphine)-silver; [bis(α-toluenethiolato)aluminum]bis[μ-(α-toluenethiolato)]bis(triisobutylphosphine)-silver; [bis(α-toluenethiolato)aluminum]bis[μ-(α-toluenethiolato)]bis(trihexylphosphine)-silver; [bis(α-toluenethiolato)aluminum]bis[μ-(α-toluenethiolato)]bis(triphenylphosphine)-silver; [bis(α-toluenethiolato)aluminum]bis[μ-(α-toluenethiolato)]bis(perfluorotriphenylphosphine)-silver; [bis(pentafluorothiophenolato)aluminum]bis[μ-(pentafluorothiophenolato)]bis(triisobutylphosphine)-silver; [bis(pentafluorothiophenolato)aluminum]bis[μ-(pentafluorothiophenolato)]bis(trihexylphosphine)-silver; [bis(pentafluorothiophenolato)aluminum]bis[μ-(pentafluorothiophenolato)]bis(triphenylphosphine)-silver; and [bis(pentafluorothiophenolato)aluminum]bis[μ-(pentafluorothiophenolato)]bis(perfluorotriphenylphosphine)-silver.

The examples of single source precursors set forth above are examples only, and those of ordinary skill in the art will understand that such examples may be used to derive many other single source precursors for use in forming other types of particles and nanoparticles using the methods described herein.

The methods described above may result in the formation of particles comprising a ternary, quaternary or multinary I-III-$VI_2$ material in the wurtzite phase and/or in the chalcopyrite phase. As known in the art, at least some ternary, quaternary or multinary I-III-$VI_2$ materials are semiconductor materials. Furthermore, in some embodiments, the particles formed from embodiments of the methods of the invention, as described herein, may comprise nanoparticles. In some embodiments, the resulting nanoparticles may have an average particle size (e.g., an average diameter) of less than or equal to 800 nm and, more particularly, less than or equal to 100 nm. In some embodiments, the nanoparticles may even have an average particle size of about 15 nm or less.

Embodiments of the present invention include methods of forming layers of semiconductor materials that include a I-III-VI$_2$ material in the chalcopyrite phase. The methods are believed to generally minimize defects, fabrication costs, and to exhibit improved efficiency relative to other methods known in the art.

Figure 2:
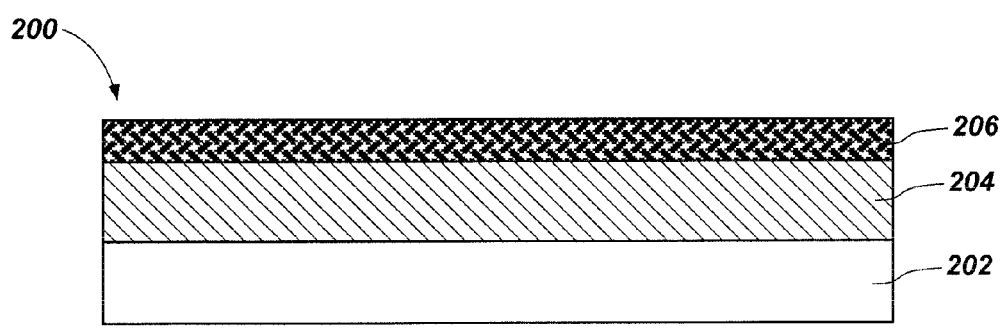
FIG. 2 is a simplified partial cross-sectional view of an embodiment of a semiconductor structure that may be formed in accordance with embodiments of methods of the present invention.

As shown in FIG. 2, a semiconductor structure 200 may be formed that includes at least a portion of a substrate 202, a first conductive material 204 overlying the substrate 202 and a particle matrix 206 in which a plurality of particles of a I-III-VI$_2$ material (i.e., I-III-VI$_2$ particles) have been dissolved or suspended. The substrate 202 may comprise, for example, a full or partial wafer of semiconductor material (e.g., silicon, germanium, gallium arsenide, indium phosphide, and other III-V type semiconductor materials), a full or partial silicon-on-insulator (SOI) type substrate, a full or partial silicon-on-sapphire (SOS) type substrate, an optically transparent material, such as a glass, quartz or fused silica, a plastic or a polyamide, a metal or metal foil, a composite material, etc. The first conductive material 204 may be formed from a conductive material, such as, molybdenum, copper, nickel, aluminum, silver, or a doped semiconductor material. For example, the first conductive material 204 may be formed over the substrate 202 using a conventional deposition process, such as, a sputtering process, a metal-organic chemical vapor deposition (MOCVD) process or a chemical vapor deposition (CVD) process.

The I-III-VI$_2$ particles may be combined with at least one carrier to form the particle matrix 206. For example, the carrier may be an organic solvent, such as, hexane, toluene, p-xylene, cyclohexane, octane, acetone, heptane, butyl acetate and benzene. By way of example and not limitation, the particle matrix 206 may be continuously agitated to form a suspension in which the particles are substantially homogeneously dispersed in the carrier or to substantially completely dissolve the particles into the carrier.

The I-III-VI$_2$ particles may be in the wurtzite phase (i.e., wurtzite particles) and/or in the chalcopyrite phase (i.e., chalcopyrite particles). For example, the chalcopyrite particles may be formed, for example, by subjecting a single source precursor (SSP) to carbon dioxide ($CO_2$), which may be in the supercritical state. Examples of methods for forming such chalcopyrite particles are described in detail in U.S. patent application Ser. No. 12/047,956, now U.S. Pat. No. 8,003,070, issued Aug. 23, 2011, the disclosure of which is hereby incorporated by reference. For example, the single source precursor may be decomposed in a supercritical fluid, such as supercritical carbon dioxide, and the chalcopyrite particles may be formed from one or more products of the decomposition of the single source precursor. Each of the chalcopyrite particles may have a generally spherical or spheriodal shape. In some embodiments, the chalcopyrite particles may have an average diameter of from about 5 nm to about 200 nm.

The wurtzite particles may be formed having a substantially larger particle size (i.e., average diameter) in comparison to the chalcopyrite particles formed from the single source precursor(s). In accordance with some embodiments, one or more single source precursors may be decomposed in a solvent in the presence of one or more thiols, such as dithiols or thiol acids, to form I-III-VI$_2$ particles in the wurtzite phase and/or the chalcopyrite phase as described with respect to FIG. 1. The single source precursors may be decomposed in the presence of the thiol, for example, using microwave radiation, thermal decomposition, or photolysis.

The I-III-VI$_2$ particles formed may comprise wurtzite particles or chalcopyrite particles or a mixture of wurtzite particles and chalcopyrite particles. For example, the I-III-VI$_2$ particles may be formed with precise stoichiometric control by decomposing a mixture of one or more single source precursors (i.e., I-III precursors) via microwave irradiation in the presence of the thiol (e.g. 1,2-ethanedithiol and/or 3-mercaptopropionic acid).

In embodiments in which the I-III-VI$_2$ particles comprise $CuIn_xGa_{1-x}S_2$, one equivalent of $(Ph_3P)_2Cu(\mu\text{-SEt})_2In(SEt)_2$ and/or $(Ph_3P)_2Cu(\mu\text{-SEt})_2Ga(SEt)_2$ may be dissolved in benzyl acetate (or in another suitable solvent) in the presence of 1,2-ethanedithiol and/or 3-mercaptopropionic acid to form a reaction mixture. The reaction mixture may be exposed to microwave radiation and may be maintained at a temperature of between about 160° C. and about 240° C. for about 1 hour to form $CuIn_xGa_{1-x}S_2$ particles in the wurtzite phase (i.e., $CuIn_xGa_{1-x}S_2$ wurtzite particles) and/or $CuIn_xGa_{1-x}S_2$ particles in the chalcopyrite phase (i.e., $CuIn_xGa_{1-x}S_2$ chalcopyrite particles). As previously discussed, a reaction temperature, a reaction time, a concentration of single source precursors and a thiol concentration may be controlled to form a desired ratio of the $CuIn_xGa_{1-x}S_2$ wurtzite particles to the $CuIn_xGa_{1-x}S_2$ chalcopyrite particles.

In embodiments in which the I-III-VI$_2$ particles comprise $CuInS_2$, $(Ph_3P)_2Cu(\mu\text{-SEt})_2In(SEt)_2$ may be dissolved in benzyl acetate (or in another suitable solvent) followed by addition of 3-mercaptopropionic acid to form a reaction mixture. The reaction mixture may be exposed to microwave radiation and may be maintained at temperatures in a range of from about 160° C. to about 240° C. for about 1 hour to form the $CuInS_2$ particles in the wurtzite phase (i.e., $CuInS_2$ wurtzite particles) and/or the $CuInS_2$ particles in the chalcopyrite phase (i.e., $CuInS_2$ chalcopyrite particles). As previously discussed, a reaction temperature, a reaction time, a concentration of single source precursors and a thiol concentration may be controlled to form a desired ratio of the $CuInS_2$ wurtzite particles to the $CuInS_2$ chalcopyrite particles.

In embodiments in which the I-III-VI$_2$ particles comprise $CuGaS_2$, $(Ph_3P)_2Cu(\mu\text{-SEt})_2Ga(SEt)_2$ may be dissolved in benzyl acetate (or in another suitable solvent) followed by addition of 3-mercaptopropionic acid to form a reaction mixture. The reaction mixture may be exposed to microwave radiation and may be maintained at temperatures in a range of from about 160° C. to about 240° C. for about 1 hour to form $CuGaS_2$ particles in the wurtzite phase (i.e., $CuGaS_2$ wurtzite particles) and/or $CuGaS_2$ particles in the chalcopyrite phase (i.e., $CuGaS_2$ chalcopyrite particles). As previously discussed, a reaction temperature, a reaction time, a concentration of single source precursors and a thiol concentration may be controlled to form a desired ratio of the $CuGaS_2$ wurtzite particles to the $CuGaS_2$ chalcopyrite particles.

The I-III-VI$_2$ wurtzite particles may each have a generally flat, hexagonal shape having a greater dimension in one plane than in another, substantially perpendicular plane. For simplicity, the greater dimension in the one plane is referred to herein as a "length" of the wurtzite particle and the smaller dimension in the another, substantially perpendicular plane is referred to herein as a "thickness" of the wurtzite particle. In some embodiments, the resulting wurtzite particles may have an average length of from about 5 nm to about 800 nm and, more particularly, from about 100 nm to about 400 nm, and an average thickness of from about 0.5 nm to about 200 nm. The wurtzite particles and the chalcopyrite particles may be selected such that the average diameter of the chalcopyrite particles is substantially equal to the average thickness of the wurtzite particles.

As previously discussed, the I-III-VI$_2$ particles (i.e., the wurtzite particles and/or the chalcopyrite particles) may be combined with or dissolved in the carrier to form the particle matrix 206. In some embodiments, the particles in the particle matrix 206 may include wurtzite particles comprising at least one of CuInS$_2$, CuIn$_x$Ga$_{(1-x)}$S$_2$, Cu(In$_x$Ga$_{1-x}$)(Se$_y$S$_{1-y}$)$_2$, CuInSe$_2$ and CuIn$_x$Ga$_{(1-x)}$Se$_2$. In other embodiments, the particles in the particle matrix 206 may include a mixture of wurtzite particles and chalcopyrite particles comprising at least one of CuInS$_2$, CUIn$_x$Ga$_{(1-x)}$S$_2$, Cu(In$_x$Ga$_{1-x}$)(Se$_y$S$_{1-y}$)$_2$, CuInSe$_2$ and CuIn$_x$Ga$_{(1-x)}$Se$_2$. For example, the particle matrix 206 may be formed by combining the carrier with a mixture of the wurtzite particles and the chalcopyrite particles at a ratio of about 100 to about 0, about 90 to about 10, about 70 to about 30, about 80 to about 20, about 50 to about 50, about 40 to about 60, about 30 to about 70, about 20 to about 80, about 10 to about 90 and about 0 to about 100.

The particle matrix 206 may be deposited over at least a portion of a surface of the first conductive material 204 using a conventional process, such as a printing process, an ink jet process or spin-coating process, the details of which are known in the art and are not described herein. For example, the particle matrix 206 may be loaded into at least one cartridge compatible with an ink jet printer and may be dispensed onto the surface of the first conductive material 204 using the same principles as those used in inkjet printers.

After the particle matrix 206 has been deposited over the first conductive material 204, the carrier may be evaporated to otherwise be removed, leaving the particles behind. For example, in embodiments in which the carrier comprises toluene, the particle matrix 206 may be exposed to a temperature greater than about 111° C. to evaporate the toluene from the particles.

Figure 3:
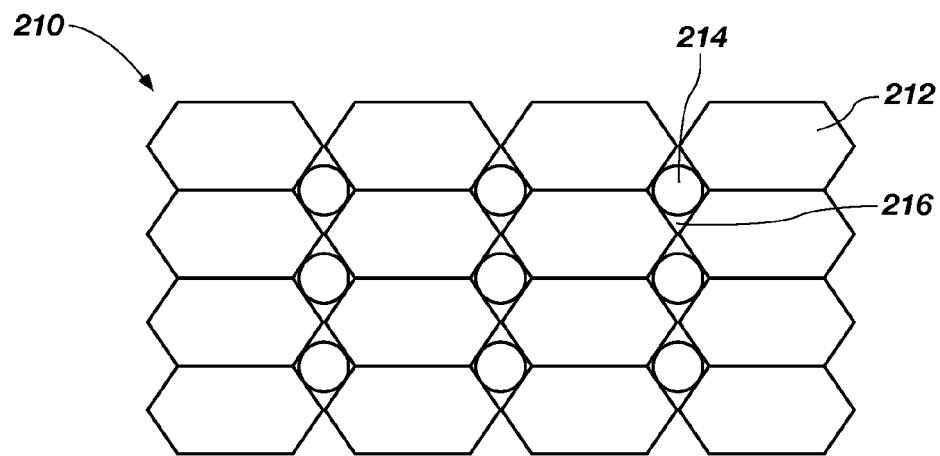
FIG. 3 is an enlarged partial cross-sectional view illustrating an embodiment of a layer of semiconductor material that may be formed using the methods described with reference to FIG. 2.

As illustrated in the simplified drawing of FIG. 3, the wurtzite particles 212 and the chalcopyrite particles 214, if present, may aggregate into a layer of particles 210. For example, the wurtzite particles 212 may spontaneously align so as to share a common crystallographic orientation with one another such that the wurtzite particles 212 are in ordered alignment within one another within the layer of particles 210. Such alignment of the wurtzite particles 212 may result in formation of a network of tightly-packed particles. The layer of particles 210 may include a plurality of voids 216 between surfaces of the aligned wurtzite particles 212. The chalcopyrite particles 214, if present, may be disposed within the voids 216. For example, the chalcopyrite particles 214 may be selected to have an average diameter less than or substantially equal to the average thickness of the wurtzite particles 212, such that the chalcopyrite particles 214 substantially fill the voids 216 between the surfaces of the wurtzite particles 212.

Figure 4:
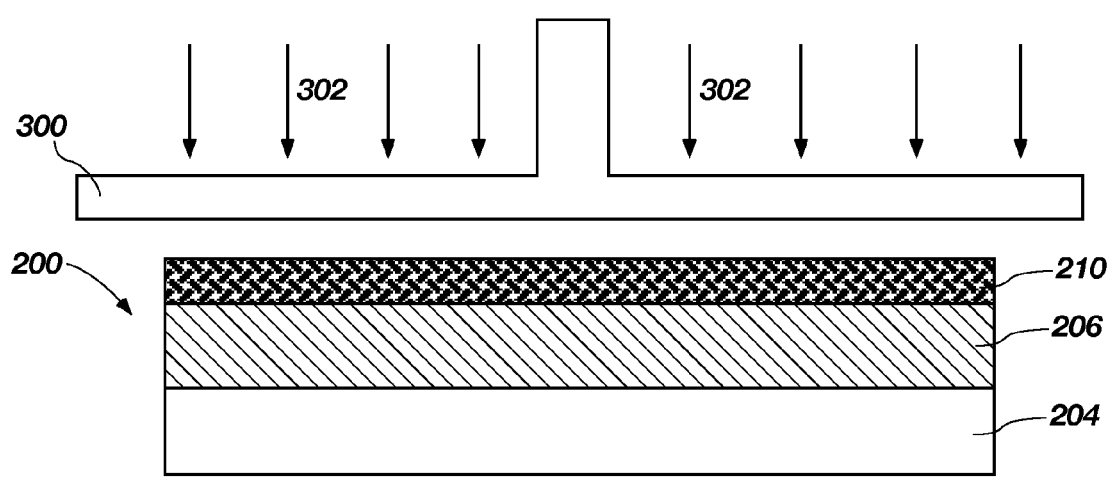
FIGS. 4 through 7 are simplified partial cross-sectional views illustrating an embodiment of a method of forming a semiconductor device.

As illustrated in FIG. 4, pressure may be applied to the layer of particles 210 to increase density of the particles (i.e., particle density) within the layer 210. For example, application of pressure to the layer of particles 210 may promote adhesion of the particles to one another and to the adjacent layer of material. As one non-limiting example, the layer of particles 210 may be subjected to a physical pressing process to increase a particle density thereof. A pressing apparatus 300 may be applied to the layer of particles 210 and a downward force may be applied as shown by directional arrows 302. As a non-limiting example, a pressure of between about 68.94 bar (about 1000 psi) and about 1378.95 bar (about 20000 psi) may be applied to the layer of particles 210 to adhere the particles to the first conductive material 204.

Figure 5:
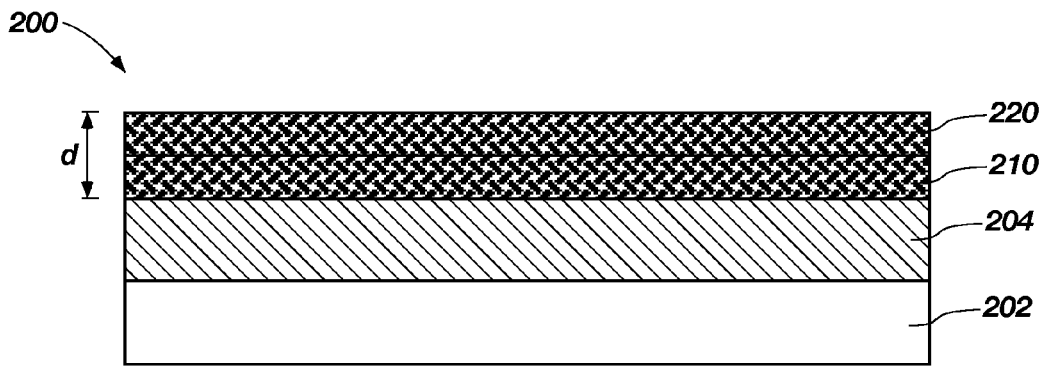

Referring to FIG. 5, after applying the pressure to the layer of particles 210, another layer of particles 220 may be formed over the layer of particles 210 using substantially the same processing acts described with respect to FIGS. 2 through 4. For simplicity, two layers of particles 210, 220 are shown in FIG. 5. However, those of ordinary skill in the art will understand that any number of layers of particles may be formed to achieve a desired thickness d of particles. By applying multiple thin layers, random defects of each layer are not likely to be repeated at the same location, therefore substantially reducing or eliminating defects through an entire thickness of material.

Figure 6:
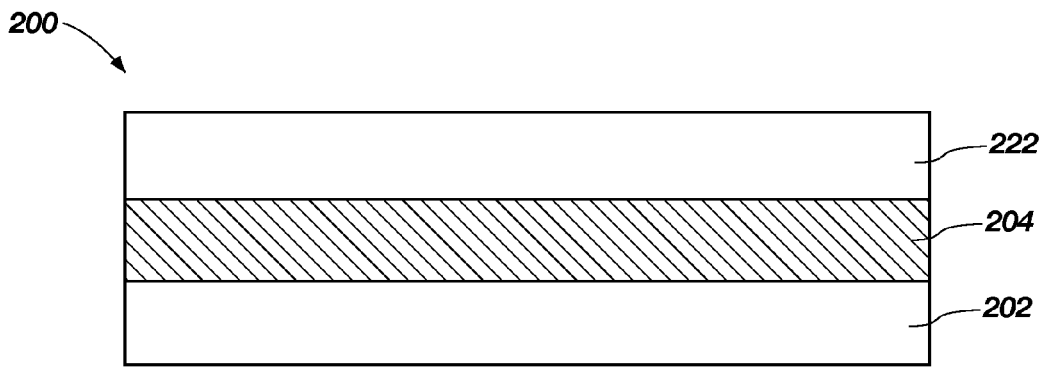

The layers of particles 210, 220 may then be subjected to an annealing process to convert the particles from the wurtzite phase to the chalcopyrite phase forming a first semiconductor material 222 comprising a I-III-VI$_2$ chalcopyrite material, as shown in FIG. 6. For example, the layers of particles 210, 220 (FIG. 5) may be exposed to argon and at least one of sulfur, tellurium and selenium at a temperature of between about 300° C. and about 600° C. for about 10 seconds to about 24 hours to convert the wurtzite particles to the chalcopyrite phase. The aligned wurtzite particles (i.e., the network of tightly packed particles) and, if present, the chalcopyrite particles, enable the particles to be converted to the unitary chalcopyrite structure using a single annealing process. The annealing process converts the particles to the chalcopyrite phase without generating defects. The average particle size and the particle distribution and number (i.e., particle density) may remain substantially constant during conversion of the wurtzite particles to chalcopyrite particles. As the wurtzite particles are converted to chalcopyrite particles, the particle alignment discussed with reference to FIG. 3 may be maintained. Thus, once the wurtzite particles are transformed to the chalcopyrite phase, the resulting chalcopyrite particles have a substantially larger particle size (i.e., average diameter), substantially increased particle density and include fewer defects than those obtainable using a single-source precursor preparation. In embodiments in which the wurtzite particles have an average length of from about 50 nm to about 100 nm and, more particularly, about 80 nm, and an average thickness of from about 0.5 nm to about 1000 nm (1 μm), the annealing process may convert the wurtzite particles to chalcopyrite particles having an average particle size (i.e., diameter) of about 0.5 nm to about 100 nm.

Figure 7:
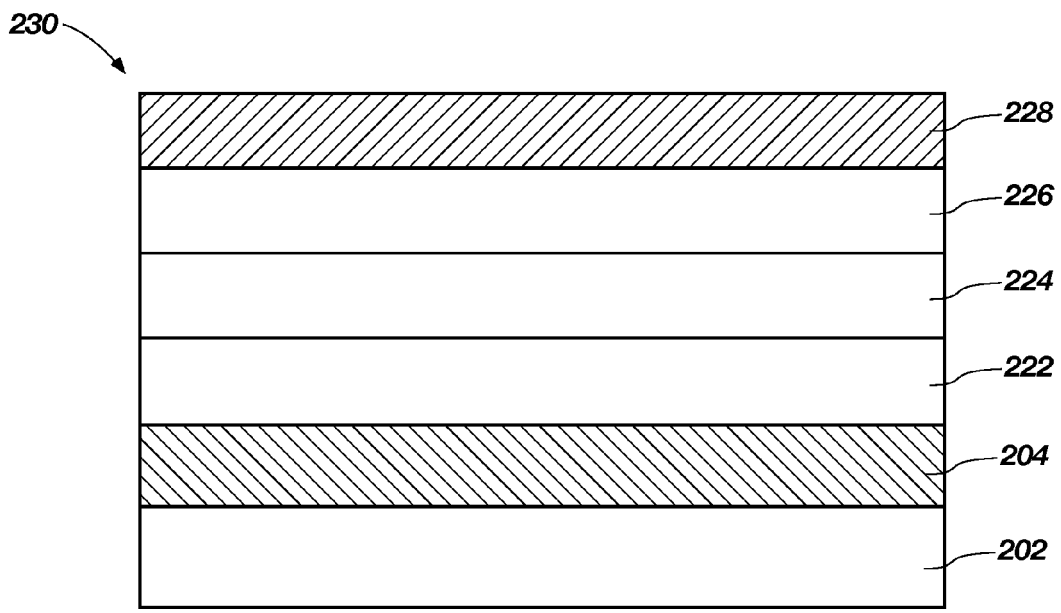

As shown in FIG. 7, a buffer material 224, a second semiconductor material 226 and a second conductive material 228 may be formed over the first semiconductor material 222. The buffer material 224 may be formed from, for example, cadmium sulfide (CdS), indium sulfide (InS) or zinc sulfide (ZnS) using a conventional deposition process, such as, a CVD process, a chemical bath deposition (CBD) process, an atomic layer deposition (ALD) process, a sputtering process, an evaporation process, etc. The buffer material 224 may then be annealed by exposing the buffer material 224 to a gaseous mixture comprising argon and at least one of sulfur, tellurium and selenium at a temperature of between about 100° C. and about 500° C. for between about 10 seconds and about 2 hours.

The second semiconductor material 226 may comprise a material that exhibits a different energy band structure than the first semiconductor material 222. The second semiconductor material 226 may be formed from, for example, a semiconductive oxide material (e.g., ZnO, ZnO:Al or TiO$_2$), a transparent conducting oxide (TCO) material (e.g., doped SnO$_2$ or ZnO), or a combination of layers of such materials. For example, the second semiconductor material 226 may comprise a layer of aluminum-doped zinc oxide (ZnO:Al) overlying a layer of zinc oxide (ZnO). The second semiconductor material 226 may be formed over the buffer material 224 using a conventional deposition process, such as a CVD process, an ALD process, a DC or RF sputtering process, etc. In embodiments in which the second semiconductor material 226 includes ZnO:Al, the ZnO:Al may be formed by depositing the ZnO over the buffer material and, thereafter, using a conventional ion implantation process to dope the ZnO with aluminum.

The second conductive material 228 may be formed over the second semiconductor material 226 to form a single junction semiconductor device 230. For example, the second conductive material 228 may be formed from a conductive material (e.g., molybdenum, copper, nickel, aluminum, silver, doped semiconductor materials, etc.). In some embodiments, the second conductive material 228 may comprise horizontally extending (with respect to a major plane of the device 230) conductive lines or traces, which may be formed by patterning (e.g., masking and etching) an at least substantially continuous sheet or layer of conductive material like that of the first conductive material 204. The first conductive material 204 and the second conductive material 228 may function as electrodes in the device 230.

Depending on the composition and configuration of the different material layers of the device 230 shown in FIG. 7, the device 230 may comprise a photovoltaic device, such as a thin-film solar cell. Furthermore, embodiments of the present invention include a diode (e.g., a light emitting diode (LED)), a radiation sensor, or another type of semiconductor device, such as, solid state laser devices, vertical cavity surface emitting lasers (VCSELs), that comprise one or more layers of semiconductor material formed using embodiments of the present invention.

The following examples serve to explain embodiments of the present invention in more detail. These examples are not to be construed as being exhaustive or exclusive as to the scope of this invention.

EXAMPLES

Comparative Example 1

Synthesis of $CuInS_2$ and $CuGaS_2$ Particles

In a dry MILESTONE™ microwave vessel $(Ph_3P)_2Cu(\mu\text{-}SEt)_2In(SEt)_2$ (6.00 g, 6.33 mmol) or $(Ph_3P)_2Cu(\mu\text{-}SEt)_2Ga(SEt)_2$ (5.71 g, 6.33 mmol) was dissolved in 40 mL of benzyl acetate $(C_6H_5CH_2CO_2CH_3, 99\%)$ followed by addition of 8 mL of 3-mercaptopropionic acid $(HSCH_2CH_2CO_2H, 99+\%)$. The benzyl acetate was obtained commercially from Alfa Aesar (Ward Hill, Mass.) and the 3-mercaptopropionic acid was obtained commercially from Acros Organics (Geel, Belgium). The solution was capped and stirred for about 5 minutes at room temperature (about 26° C.). The reaction mixture was placed in a Milestone ETHOS EX™ microwave extraction system. The reaction mixture was then irradiated with microwave radiation to provide reaction temperatures in a range of from about 160° C. to about 240° C. for 1 hour. Upon completion, the reaction mixture was cooled to room temperature to yield precipitation of $CuInS_2$ and $CuGaS_2$ chalcopyrite and wurtzite particles. The resulting particles were isolated from the benzyl acetate solution by centrifugation, collected, and washed three times with methanol ($CH_3OH$). The particles were then dried under vacuum pressure to provide yellow to black powder. For example, less than or equal to about 1.5 g of the $CuInS_2$ and $CuGaS_2$ chalcopyrite and wurtzite particles may be prepared in the MILESTONE™ microwave vessel.

Table 1 shows the composition, crystal phase, and optical bandgap of the resulting $CuInS_2$ and $CuGaS_2$ particles formed at temperatures between about 160° C. and about 240° C. using the previously described methods. The composition of the particles was determined using inductively coupled plasma atomic emission spectroscopy (ICP-OES) analysis, the crystal phase of the particles was determined using X-ray diffraction (XRD) and the optical bandgap of the particles was determined using ultraviolet visible (UV-Vis) spectroscopy.

TABLE 1

| Entry | Temp. | % Cu | % In or Ga | Ratio of Cu to In or Ga | Crystalline phase | $E_g$ |
| --- | --- | --- | --- | --- | --- | --- |
| 1 | 240° C. | 21.03 | 21.85 | 0.96 | Wurtzite | 2.02 eV |
| 2 | 160° C. | 13.74 | 11.57 | 1.19 | Chalcopyrite | 1.85 eV |
| 3 | 180° C. | 19.96 | 18.05 | 1.11 | Chalcopyrite | 1.56 eV |
| 4 | 200° C. | 20.84 | 19.89 | 1.05 | Chalcopyrite/ Wurtzite | 1.38 eV |
| 5 | 220° C. | 24.69 | 24.31 | 1.02 | Wurtzite | 1.34 eV |
| 6 | 230° C. | 24.75 | 23.18 | 1.07 | Wurtzite | 1.30 eV |

The analysis of $CuInS_2$ and $CuGaS_2$ particles by ICP-OES (i.e., % Cu and % In or Ga) demonstrates that such methods of forming $I\text{-}III\text{-}IV_2$ particles (e.g., $CuInS_2$ and $CuGaS_2$ particles) provide precise control of ratios of Group I element-to-Group III element (e.g., copper-to-indium or copper-to-gallium) within the $I\text{-}III\text{-}IV_2$ particles.

Figure 8:
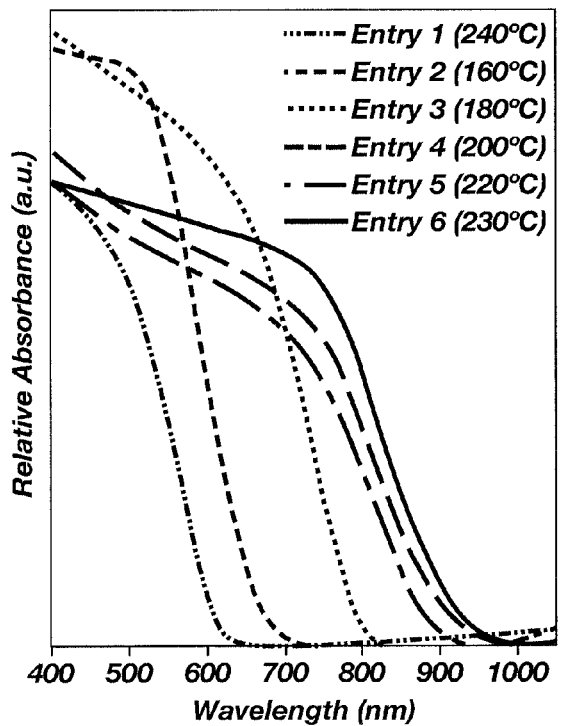
FIG. 8 is an absorption spectra generated from $CuInS_2$ and $CuGaS_2$ particles formed in accordance with embodiments of methods of the present invention.

FIG. 8 is a normalized UV-Vis absorption spectra of the $CuInS_2$ and $CuGaS_2$ particles. An absorption peak shifts to lower energy as the $CuInS_2$ and $CuGaS_2$ particles are grown at increasing reaction temperatures. A bandgap range (i.e., about 1.30 eV to about 2.02 eV) achieved from $CuInS_2$ and $CuGaS_2$ particles fits between the bandgaps of bulk $CuInS_2$ (1.50 eV) and bulk $CuGaS_2$ (2.40 eV). As shown in FIG. 8, visible spectra of the $CuInS_2$ and $CuGaS_2$ particles are different between the chalcopyrite and wurtzite phases. The $CuInS_2$ and $CuGaS_2$ particles produced at lower reaction temperatures have sharp absorbance behavior with band gaps near 660 nm (1.85 eV), whereas the $CuInS_2$ and $CuGaS_2$ particles produced at increased reaction temperatures have weaker absorbance behavior in general and band gaps approaching 920 nm (1.30 eV).

Figure 9:
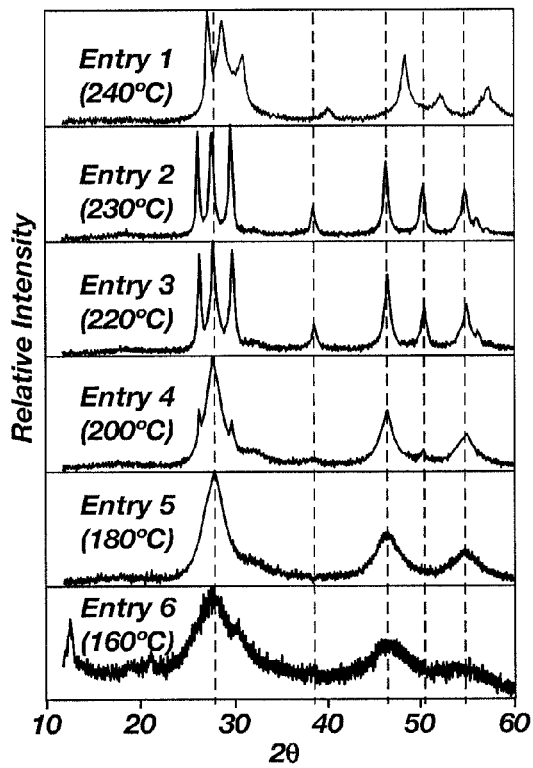
FIG. 9 shows X-ray diffraction spectra of the $CuInS_2$ and $CuGaS_2$ particles formed in accordance with embodiments of methods of the present invention.

FIG. 9 shows normalized XRD data obtained from the $CuInS_2$ and $CuGaS_2$ particles. Entry 5 and Entry 6 show particles in the chalcopyrite phase. Entry 4 begins to show formation of wurtzite phase particles mixed with the particles in the chalcopyrite phase. Entry 2 and Entry 3 show mostly particles in the wurtzite phase. Entry 1 shows mixed phases. The XRD patterns of chalcopyrite particles show three major peaks at $2\theta=28°$, 46.4° and 55° for pure $CuInS_2$ and at $2\theta=29.1°$, 48.7° and 57.2° for pure $CuGaS_2$. While the XRD patterns of wurtzite particles show many major peaks that distinguish them from the chalcopyrite particles. The XRD patterns of wurtzite particles show major peaks at $2\theta=26.3°$, 27.8°, 29.8°, 38.6°, 46.4°, 50.4° and 54.9° for pure $CuInS_2$ and at $2\theta=27.4°$, 28.9°, 31°, 40.2°, 48.4°, 52.3° and 57.4° for pure $CuGaS_2$. The peaks are consistent with the wurtzite phase of $CuInS_2$ reference pattern 85-1575 (JCPDS-03-065-2732) and the wurtzite phase of $CuGaS_2$ as shown in reference pattern 25-0279 (JCPDS-01-082-1531) (The INTERNATIONAL CENTRE FOR DIFFRACTION DATA®). In FIG. 9, XRD spectra of the nanoparticles produced clearly shows the shift in phase from Chalcopyrite at below 180° C. to a mixture of chalcopyrite and wurtzite at 200° C. to Wurtzite phase above 220° C.

Example 2

Synthesis of CuIn$_x$Ga$_{1-x}$S$_2$ Wurtzite Particles

Synthesis of pre-copolymer single source precursors: one equivalent of each of (Ph$_3$P)$_2$Cu(μ-SEt)$_2$In(SEt)$_2$ (6.00 g, 6.33 mmol) and (Ph$_3$P)$_2$Cu(μ-SEt)$_2$Ga(SEt)$_2$ (5.71 g, 6.33 mmol) may be dissolved in 60 mL of dried benzene or in another suitable solvent in the presence of about one equivalent (1.06 mL, 12.66 mmol) of 1,2-ethanedithiol (HSCH$_2$CH$_2$SH, 99.8%) to form a reaction mixture. The dried benzene may be prepared by drying and degassing using a solvent purification system (i.e., activated alumina, copper catalyst and molecular sieves columns) commercially obtained from Innovative Technology Inc. The 1,2-ethanedithiol may be obtained commercially from Alfa Aesar. The mixture may be stirred at room temperature for 5 minutes, the liquid may be evaporated off to afford pre-copolymer single source precursors. In a dry MILESTONE™ microwave vessel, various amount of pre-copolymer single source precursors and various amount of (Ph$_3$P)$_2$Cu(μ-SEt)$_2$In(SEt)$_2$ or (Ph$_3$P)$_2$Cu(μ-SEt)$_2$Ga(SEt)$_2$ may be dissolved or suspended in 40 mL of benzyl acetate (C$_6$H$_5$CH$_2$CO$_2$CH$_3$, 99%) or in another suitable solvent followed by addition of 8 mL of 3-mercaptopropionic acid (HSCH$_2$CH$_2$CO$_2$H, 99+%). For example, the benzyl acetate may be obtained commercially from Alfa Aesar (Ward Hill, Mass.) and the 3-mercaptopropionic acid may be obtained commercially from Acros Organics (Geel, Belgium). The solution or suspension may be capped and stirred for about 5 minutes at room temperature to form a reaction mixture. The reaction mixture may be placed in a Milestone ETHOS EX™ microwave extraction system. The reaction mixture may be irradiated with microwave radiation and held at a desired reaction temperature (i.e., in a range of from about 230° C. to about 240° C.) for less than 1 hour. Upon completion, the reaction mixture may be cooled to room temperature to yield precipitation of CuIn$_x$Ga$_{1-x}$S$_2$ (0≤x≤1) wurtzite particles. The resulting CuIn$_x$Ga$_{1-x}$S$_2$ wurtzite particles may be isolated from the benzyl acetate solution by centrifugation, collected, and washed three times with methanol. The product may be then dried under vacuum pressure to provide yellow to black powder.

Table 2 shows the composition and optical bandgap (E$_g$) of the resulting CuIn$_x$Ga$_{1-x}$S$_2$ particles formed at temperatures between about 230° C. and about 240° C. using the previously described methods. The composition of the particles was determined using inductively coupled plasma atomic emission spectroscopy (ICP-OES) analysis and the optical bandgap of the particles was determined using ultraviolet visible (UV-Vis) spectroscopy. (The measurements by ICP-OES have an error of ±0.2 atom % for Cu, ±0.5 atom % for In, and ±0.2 atom % for Ga).

TABLE 2

| Entry | Atomic Percent | | | In + Ga | Cu/ (In + Ga) | Ratio of In to Ga | | E$_g$ (eV) |
|---|---|---|---|---|---|---|---|---|
| | Cu | In | Ga | | | ICP | Exp. | |
| 1 | 21.03 | 0.00 | 21.85 | 21.85 | 0.96 | 0.00/1.00 | 0.00/1.00 | 2.02 |
| 9 | 21.19 | 4.71 | 16.67 | 21.38 | 0.99 | 0.22/0.78 | 0.25/0.75 | 1.60 |
| 10 | 23.08 | 7.41 | 15.88 | 23.28 | 0.99 | 0.32/0.68 | 0.33/0.67 | 1.58 |
| 11 | 26.14 | 11.77 | 12.63 | 24.40 | 1.07 | 0.48/0.52 | 0.50/0.50 | 1.48 |
| 12 | 22.86 | 13.80 | 7.10 | 20.89 | 1.09 | 0.66/0.34 | 0.70/0.30 | 1.40 |
| 13 | 25.67 | 22.14 | 2.98 | 25.12 | 1.02 | 0.88/0.12 | 0.90/0.10 | 1.36 |
| 6 | 24.75 | 23.18 | 0.00 | 23.18 | 1.07 | 1.00/0.00 | 1.00/0.00 | 1.30 |

Figure 10:
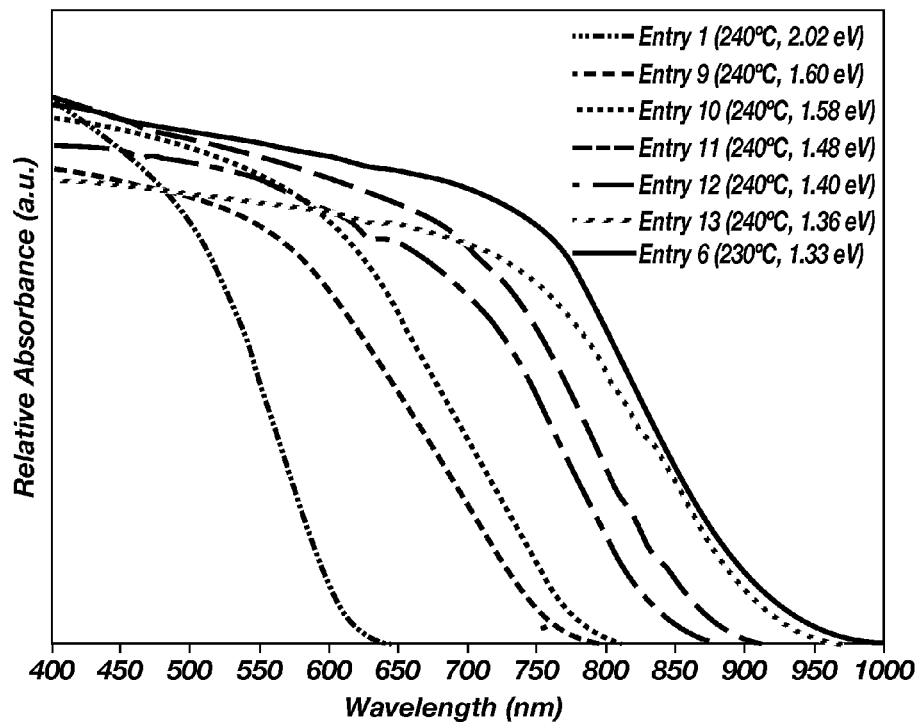
FIG. 10 is an absorption spectra generated from $CuIn_xGa_{1-x}S_2$ particles formed in accordance with embodiments of methods of the present invention.

FIG. 10 is a normalized UV-Vis absorption spectra of the CuIn$_x$Ga$_{1-x}$S$_2$ particles. As shown in FIG. 10, an absorption peak shifts to lower energy when the CuIn$_x$Ga$_{1-x}$S$_2$ particles are grown at higher concentrations of indium. A bandgap range (1.30 to 2.02 eV) of the CuIn$_x$Ga$_{1-x}$S$_2$ particles fits between the bandgaps of bulk CuInS$_2$ (1.50 eV) and bulk CuGaS$_2$ (2.40 eV).

Figure 11:
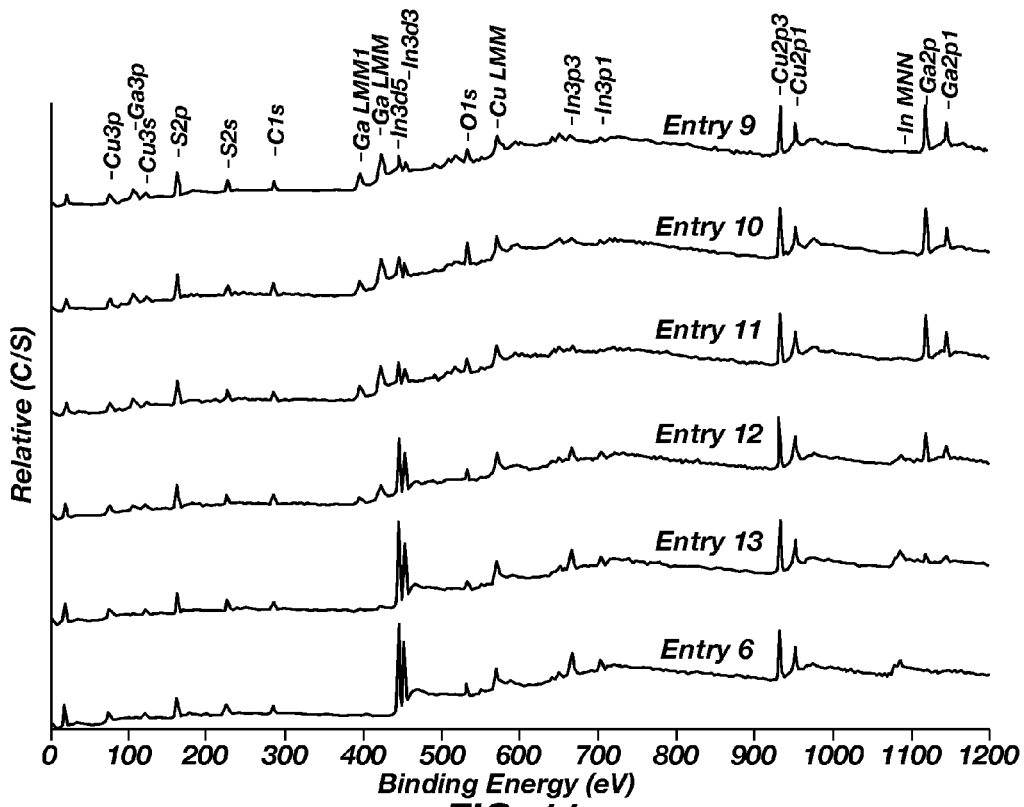
FIG. 11 shows X-ray photoelectron spectroscopy (XPS) spectra obtained from the $CuIn_xGa_{1-x}S_2$ formed in accordance with embodiments of methods of the present invention.

FIG. 11 shows data obtained from X-ray photoelectron spectroscopy (XPS) analysis of CuIn$_x$Ga$_{1-x}$S$_2$ particles. These data provide a qualitative comparison of XPS data demonstrating the formation of particles containing Cu, In, Ga, and S with some carbon and oxygen from the 1,2-ethanedithiol and 3-mercaptopropionic acid. Modulation between gallium and indium of the CuIn$_x$Ga$_{1-x}$S$_2$ particles is reflected in the XPS data.

Figure 12:
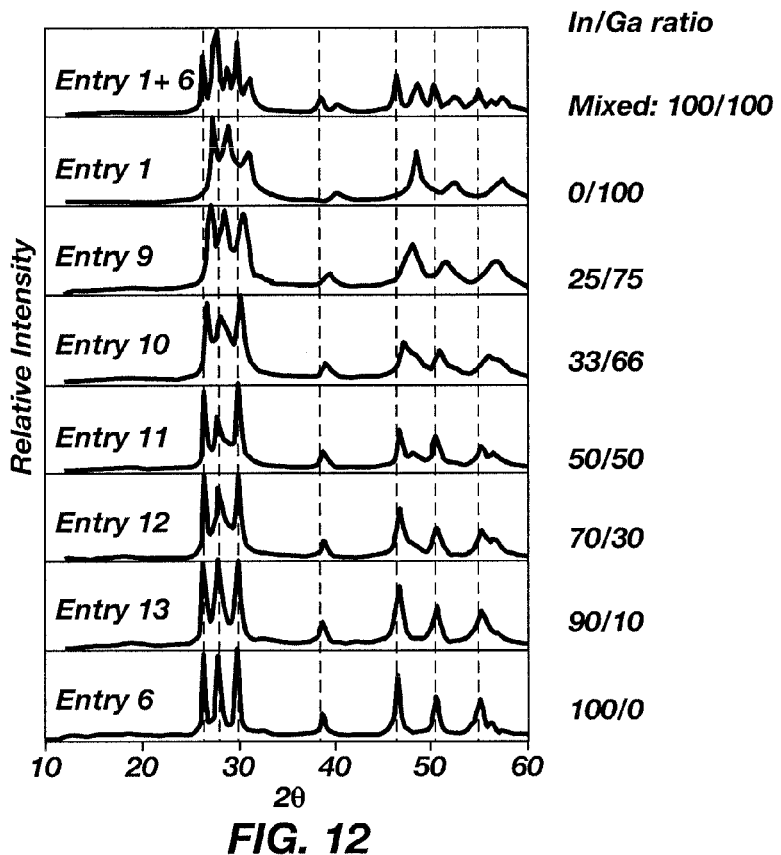
FIG. 12 shows X-ray diffraction spectra of the $CuIn_xGa_{1-x}S_2$ particles formed in accordance with embodiments of methods of the present invention.

FIG. 12 shows normalized XRD data obtained from the CuIn$_x$Ga$_{1-x}$S$_2$ particles showing that the quaternary particles formed are CuIn$_x$Ga$_{1-x}$S$_2$ nanoparticles in the wurtzite phase with major peaks shifting toward narrower lattice spacing as expected, as a function of increasing gallium content. Entry 1+6 shows that physically mixed pure CuInS$_2$ and pure CuGaS$_2$ (1:1 ratio) includes all the respective peaks of CuInS$_2$ and CuGaS$_2$ individually confirming that the CuIn$_x$Ga$_{1-x}$S$_2$ particles are alloyed.

Specific reaction control is utilized to synthesize CuIn$_x$Ga$_{1-x}$S$_2$ particles in the wurtzite phase. When an excess amount of 1,2-ethanedithiol was used with 3-mercaptopropionic acid, CuIn$_x$Ga$_{1-x}$S$_2$ particles in the chalcopyrite phase were formed. One equivalent of 1,2-ethanedithiol and excess of 3-mercaptopropionic acid formed the CuIn$_x$Ga$_{1-x}$S$_2$ particles in the wurtzite phase. This suggests that the presence and quantity of 1,2-ethanedithiol and 3-mercaptopropionic acid have an influence on phase determination.

The CuIn$_{0.9}$Ga$_{0.1}$S$_2$ particles were polydisperse with a mean diameter of 15±4 nm, as determined by transmission electron microscopy (TEM) analysis. The lattice parameters calculated from selected area electron diffraction (SAED) patterns of several randomly chosen regions of the CuIn$_x$Ga$_{1-x}$S$_2$ particles were consistent with the lattice parameters calculated from the XRD pattern for wurtzite CuIn$_x$Ga$_{1-x}$S$_2$.

Example 3

Synthesis of CuIn$_x$Ga$_{1-x}$S$_2$ Wurtzite Particles

In a dry MILESTONE™ microwave vessel, (Ph$_3$P)$_2$Cu(μ-SEt)$_2$In(SEt)$_2$ and (Ph$_3$P)$_2$Cu(μ-SEt)$_2$Ga(SEt)$_2$, may be dissolved in 40 mL of benzyl acetate (C$_6$H$_5$CH$_2$CO$_2$CH$_3$, 99%) followed by addition of 8 mL of 3-mercaptopropionic acid (HSCH$_2$CH$_2$CO$_2$H, 99+%). For example, the benzyl acetate may be obtained commercially from Alfa Aesar (Ward Hill, Mass.) and the 3-mercaptopropionic acid may be obtained commercially from Acros Organics (Geel, Belgium). The solution may be capped and stirred for about 5 minutes at room temperature to form a reaction mixture. The reaction mixture may be irradiated with microwave radiation to maintain a temperature of about 240° C. for about 1 hour. Upon completion, the reaction mixture may be cooled to room temperature to yield precipitation of CuIn$_x$Ga$_{1-x}$S$_2$ (0≤x≤1) wurtzite particles. The resulting CuIn$_x$Ga$_{1-x}$S$_2$ wurtzite particles may be isolated from the benzyl acetate by centrifugation, collected, and washed three times with methanol. The product may be then dried under vacuum pressure to provide a powder having a color ranging from yellow to black. The resulting wurtzite particles may exhibit darker color as a function of increasing indium content and represent respective bandgap changes in the CuIn$_x$Ga$_{1-x}$S$_2$ nanoparticles. For example, up to 1 gram of $CuIn_xGa_{1-x}S_2$ (0≤x≤1) wurtzite particles may be formed in a single vessel.

Example 4

Synthesis of $CuIn_xGa_{1-x}S_2$ Wurtzite Particles

In a dry MILESTONE™ microwave vessel, $(Ph_3P)_2Cu(\mu\text{-}SEt)_2In(SEt)_2$ (8.40 g, 8.86 mmol) and $(Ph_3P)_2Cu(\mu\text{-}SEt)_2Ga(SEt)_2$ (3.43 g, 3.80 mmol) may be dissolved in 60 mL of benzyl acetate ($C_6H_5CH_2CO_2CH_3$, 99%) or in another suitable solvent followed by addition of 2.2 mL of 1,2-ethanedithiol ($HSCH_2CH_2SH$, 99.8%) and 15 mL of 3-mercaptopropionic acid ($HSCH_2CH_2CO_2H$, 99+%). For example, the benzyl acetate may be obtained commercially from Alfa Aesar (Ward Hill, Mass.), the 3-mercaptopropionic acid may be obtained commercially from Acros Organics (Geel, Belgium) and the 1,2-ethanedithiol may be obtained commercially from Alfa Aesar. The solution may be capped and stirred for about 5 minutes at room temperature to form a reaction mixture. The reaction mixture may be irradiated with microwave radiation to maintain a temperature of about 240° C. for about 1 hour. Upon completion, the reaction mixture may be cooled to room temperature to yield precipitation of $CuIn_xGa_{1-x}S_2$ (0≤x≤1) wurtzite particles. The resulting $CuIn_xGa_{1-x}S_2$ wurtzite particles may be isolated from the benzyl acetate by centrifugation, collected, and washed three times with methanol. The product may be then dried under vacuum pressure to provide a powder having a color ranging from yellow to black. The resulting wurtzite particles may exhibit darker color as a function of increasing indium content and represent respective bandgap changes in the $CuIn_xGa_{1-x}S_2$ nanoparticles. For example, up to 3 grams of $CuIn_xGa_{1-x}S_2$ (0≤x≤1) wurtzite particles may be formed in a single vessel.

Example 5

Fabrication and Characterization of Thin Film Solar Cell Made from $CuIn_xGa_{1-x}S_2$ Wurtzite Nanoparticles A solar cell was formed including a $CuIn_xGa_{1-x}S_2$ absorption material. The solar cell was formed using methods substantially similar to those for forming the single junction semiconductor device 230 described with respect to FIGS. 2 through 7, the details of which are hereinafter described. A first conductive material 204 comprising molybdenum was formed over a substrate 202 comprising glass. The molybdenum first conductive material 204 was formed by a DC sputtering process using a Denton Desktop Pro sputtering system, which is commercially available from Denton Vacuum, LLC (Moorestown, N.J.). A 300 mA current was used and pressure was held at 5 mtorr. The molybdenum first conductive material 204 was formed having a thickness of about 0.5 μm and a resistivity of 5 $E^{-5}$ ohm-cm.

A first semiconductor material 222 comprising $CuIn_xGa_{1-x}S_2$ was formed using methods previously described. The $CuIn_xGa_{1-x}S_2$ absorption layer is the critical for proper function of the solar cell. In order to compare the effect of the chalcopyrite and wurtzite particles on the properties of the solar cell, two types of particles (i.e., first particles and second particles) were formed from single source precursors using the methods previously described herein. First particles were formed comprising $CuIn_xGa_{1-x}S_2$ in a chalcopyrite phase (i.e., $CuIn_xGa_{1-x}S_2$ chalcopyrite particles), containing about 30% gallium and having an average particle size of greater than about 3 nm. Second particles were formed comprising $CuIn_xGa_{1-x}S_2$ in a wurtzite phase (i.e., $CuIn_xGa_{1-x}S_2$ wurtzite particles), containing about 30% gallium and having an average particle size of less than or equal to about 100 nm. A first slurry and a second slurry 206 were formed from each of the first particles and the second particles by respectively combining the first particles or the second particles with a toluene solvent. The first and second slurries 206 respectively included about 20 wt % of the first particles and the second particles. The first and second slurries 206 were separately applied over the molybdenum first conductive material 204 on different glass substrates 202 to form the layer of particles 210 over each of the glass substrates 202. A pressure of about 689.5 bar (about 10000 psi) was applied to the layer of particles 210 overlying each of the glass substrates 202 to increase the particle density. The layers of particles were then subjected to an annealing process by exposure to a temperature of about 450° C. for about 1 hour in sulfur and argon gases. Multiple applications of slurries 206 were performed as described with respect to FIGS. 2 through 5 to minimize defects in layers of particles and to achieve a thickness of about 5 μm.

Figure 13:
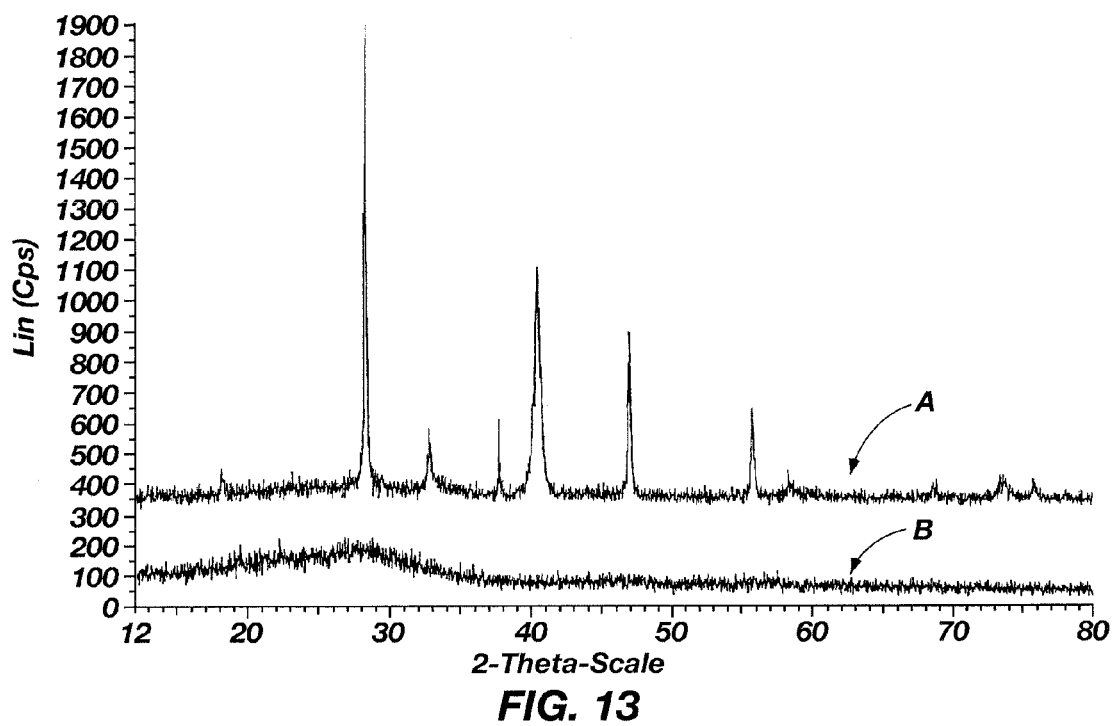
FIG. 13 shows X-ray diffraction spectra of the $CuIn_xGa_{1-x}S_2$ chalcopyrite particles formed in accordance with embodiments of methods of the present invention before and after an annealing process.
Figure 14:
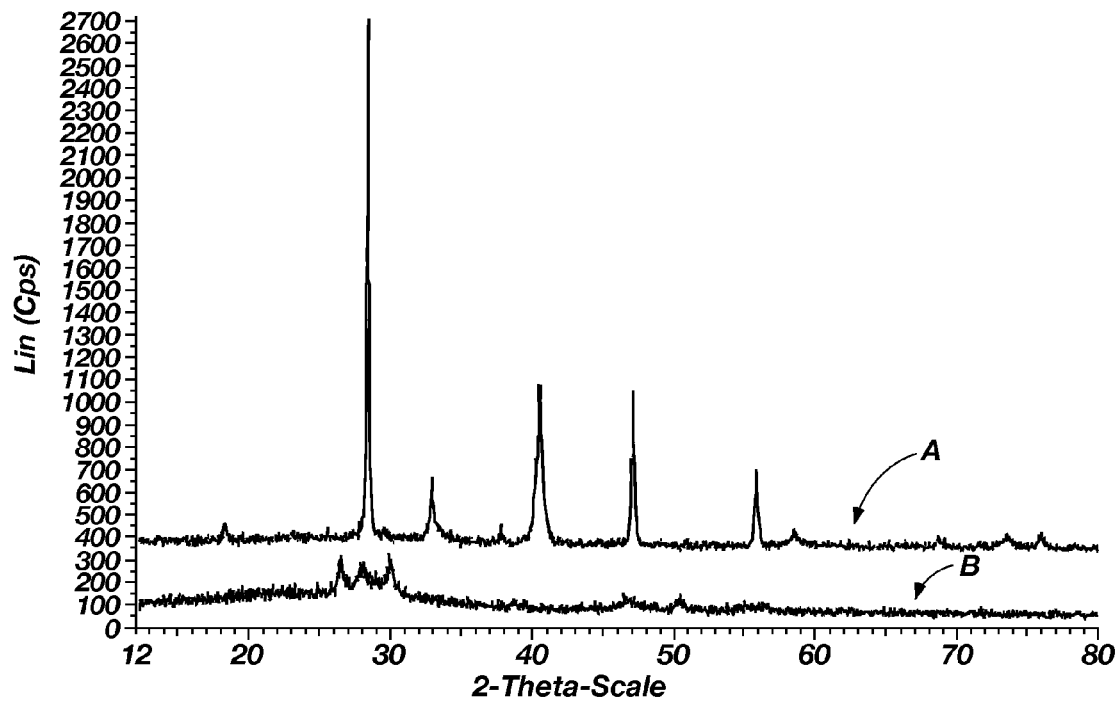
FIG. 14 shows X-ray diffraction spectra of the $CuIn_xGa_{1-x}S_2$ wurtzite particles formed in accordance with embodiments of methods of the present invention before and after an annealing process.

FIGS. 13 and 14 respectively show XRD data obtained from the $CuIn_xGa_{1-x}S_2$ chalcopyrite particles and the $CuIn_xGa_{1-x}S_2$ wurtzite particles before and after annealing. In FIGS. 13 and 14, one plot ("A") shows XRD data obtained before the annealing process and another plot ("B") shows XRD data obtained after the annealing process. As shown in FIG. 13, after performing the annealing process on the $CuIn_xGa_{1-x}S_2$ chalcopyrite particles, the resulting particles have a substantially increased particle size and remain in the chalcopyrite phase. As shown in FIG. 14, after performing the annealing process on the $CuIn_xGa_{1-x}S_2$ wurtzite particles, the resulting particles have a substantially increased particle size and have been converted to the chalcopyrite phase. In scanning electron micrographs (SEMs) of the resulting particles, it was observed that the particle sizes were increased to about 150 nm during annealing for both the $CuIn_xGa_{1-x}S_2$ chalcopyrite particles and the $CuIn_xGa_{1-x}S_2$ wurtzite particles (converted to chalcopyrite particles). While not wishing to be bound by any particular theory, it is believed that the increase in particle size results from fusion of the particles to form a substantially continuous path for electron carriers. The XRD peak intensities show that the annealed particles comprise greater than or equal to about 90% chalcopyrite particles.

A buffer material 224 comprising CdS was deposited over the first semiconductor material 222 using a chemical bath deposition (CBD) method from a solution containing cadmium chloride ($CdCl_2.2H_2O$), ammonium hydroxide ($NH_4OH$), ammonium chloride ($NH_4Cl$), and thiourea ($CS(NH_2)_2$). The temperature of the solution was about 70° C. and deposition time was about 45 minutes. A thickness of about 100 nm of the CdS buffer material 224 was formed. After forming the CdS buffer material 224, an annealing process was performed to increase density of the CdS buffer material 224. The annealing process was performed by exposing the CdS buffer material 224 to a temperature of about 200° C. in an argon and sulfur atmosphere. A second semiconductor material 226 comprising a ZnO layer and a ZnO:Al layer was then formed over the CdS buffer material 224 using the Denton Desktop Pro sputtering system. The ZnO layer was formed by a DC sputtering process at a current of 80 mA, a temperature of about 160° C., respective argon and oxygen flow rates of 21 sccm and 14 sccm and a chamber pressure at around 5 mtorr. The ZnO layer was formed having a thickness of about 100 nm and a resistivity of about 3.14× $10^3$ ohm-cm with 90% transparency. The ZnO:Al layer was formed over the ZnO layer by an RF sputtering process using the Denton Desktop Pro sputtering system. The RF target was ZnO with 2 wt % of $Al_2O_3$. The RF power was maintained at 100 W and substrate temperature was at maintained at about 160° C. during the RF sputtering process. The ZnO:Al layer formed using the RF sputtering process was formed with a thickness of about 400 nm and exhibited a resistivity of about $9.02 \times 10^{-3}$ ohm-cm with 90% transparency at a 700 nm wavelength. A silver (Ag) paste was applied over the second semiconductor material 226 to form the second conductive material 228.

The solar cell had a light collecting area of about 0.0025 $cm^2$. The solar cell characteristics were measured using a SCIENCETECH™ solar simulator equipped with an AM 1.5 global filter from Sciencetech, Inc. (Ontario, Canada) and a 2400 Series SOURCEMETER™ electronic test instrument from Keithley Instruments, Inc. (Cleveland, Ohio). Calibration of light intensity was performed using an OCEAN OPTICS® light sensor from Ocean Optics, Inc. (Dunedin, Fla.).

Figure 15:
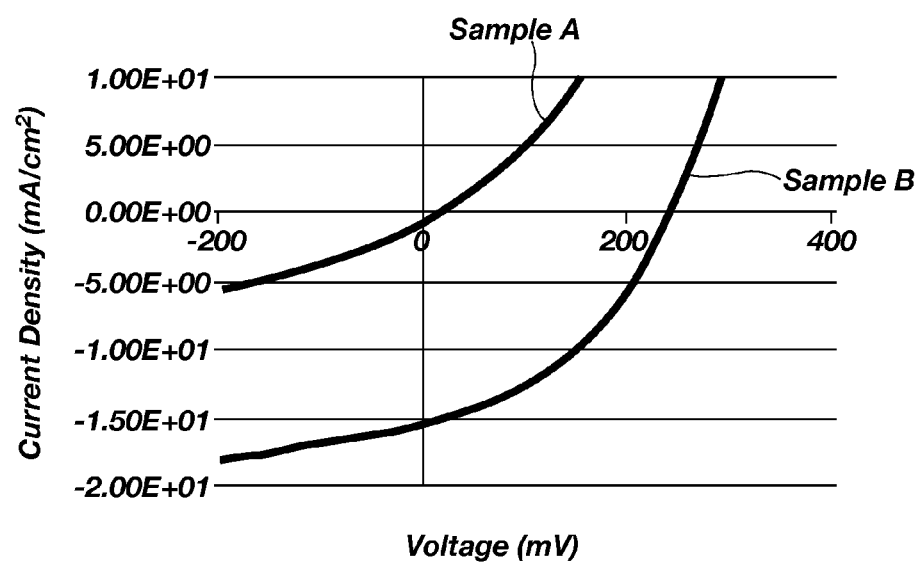
FIGS. 15 and 16 are current-voltage characteristics (i.e., IV curves) generated from embodiments of semiconductor devices formed in accordance with embodiments of the present invention.

FIG. 15 shows IV curves of the solar cells including the first semiconductor material 222 formed from the $CuIn_xGa_{1-x}S_2$ chalcopyrite particles ("sample A") and the solar cell including the first semiconductor material 222 formed from the $CuIn_xGa_{1-x}S_2$ wurtzite particles ("sample B"). As shown in FIG. 15, sample B (i.e., the solar cell including the first semiconductor material 222 formed from the $CuIn_xGa_{1-x}S_2$ wurtzite particles) exhibited an efficiency of 1.68% with fill factor (FF) of 0.42. Under the same conditions, sample A (i.e., the solar cell including the first semiconductor material 222 formed from the $CuIn_xGa_{1-x}S_2$ chalcopyrite particles) exhibited a substantially reduced current and voltage in comparison to the solar cell including the first semiconductor material 222 formed from the $CuIn_xGa_{1-x}S_2$ wurtzite particles. While not wishing to be bound by any particular theory, it is believe that the reduced current and voltage of sample A may result from the smaller particle size of the $CuIn_xGa_{1-x}S_2$ chalcopyrite particles. Such $CuIn_xGa_{1-x}S_2$ chalcopyrite particles include an increased concentration of organic ligand and may be difficult to fully evaporate during single step annealing. In addition, particle phase change (i.e., conversion of the particles from wurtzite to chalcopyrite phase) may result in formation of a first semiconductor material 222 having an increased density in comparison to such materials formed by conventional deposition techniques.

Figure 16:
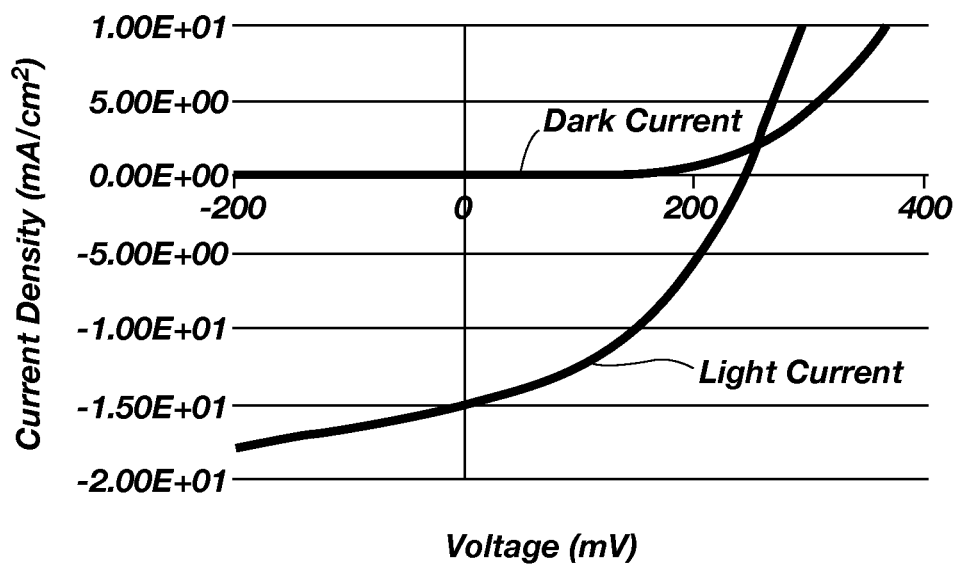

FIG. 16 shows IV curves of light current and dark current of sample B. As shown in FIG. 16, sample B exhibited an open-circuit current (Voc) of about 234 mV and a short circuit current (Isc) of about 15 mA/$cm^2$. A conventional CIGS solar cell has a Voc of between about 300 mV and about 600 mV and an Isc of between about 20 mA/$cm^2$ and about 40 mA/$cm^2$. Thus, the Voc of sample B is substantially reduced in comparison to the Voc of solar cells including $CuIn_xGa_{1-x}S_2$ absorption layers formed by conventional processes, such as an evaporation process or a sputtering process. While not wishing to be bound by any particular theory, it is believed that the reduced Voc in such solar cells may be caused by porosity, cracking and pinhole defects of the $CuIn_xGa_{1-x}S_2$ absorption layer. Such defects may increase leakage current and reduce shunt resistance in the solar cell. The disclosed methods provide fabrication of higher efficiency solar cells.

Compared to the solar cell including the first semiconductor material 222 formed from the $CuIn_xGa_{1-x}S_2$ chalcopyrite particles, the solar cell including the first semiconductor material 222 formed from the $CuIn_xGa_{1-x}S_2$ wurtzite particles exhibited substantially improved photovoltaic properties. While not wishing to be bound by any particular theory, it is believed that the size of the $CuIn_xGa_{1-x}S_2$ wurtzite particles used to form the first semiconductor material 222 and change in phase from wurtzite to chalcopyrite may result in a denser $CuIn_xGa_{1-x}S_2$ material with substantially reduced defects, which is critical for performance of photovoltaic devices, such as a solar cell.

While the invention may be susceptible to various modifications and alternative forms, specific embodiments of which have been shown by way of example in the drawings and have been described in detail herein, it should be understood that the invention is not intended to be limited to the particular forms disclosed. Rather, the invention includes all modifications, equivalents, and alternatives falling within the scope of the invention as defined by the following appended claims and their legal equivalents.

What is claimed is:

1. A method for forming particles, the method comprising:
reacting at least two single source precursors with a dithiol to form a pre-copolymer of the at least two single source precursors, the at least two single source precursors comprising at least two of a copper-indium single source precursor, a copper-gallium single source precursor, a silver-indium single source precursor, a silver-gallium single source precursor, a copper-aluminum single source precursor, or a silver-aluminum single source precursor, the dithiol comprising 1,2-ethanedithiol, 1,1-methanedithiol, phenyl-1,2-ethanedithiol, 1,3-propanedithiol, 2,2-propanedithiol, 1,2,-propanedithiol, 2,2-dimethyl-1,3-propanedithiol, 2-sec-butyl-2-methyl-1,3-propanedithiol, 1,3-diphenyl-2,2-propanedithiol, 1,4-butanedithiol, 2,3-butanedithiol, 2,2-butanedithiol, 1,3-isobutanedithiol, 1,5-pentanedithiol, 1,6-hexanedithiol, 1,2-hexanedithiol, 2-ethyl-1,6-hexanedithiol, 2,5-dimethyl-3,4-hexanedithiol, 2,5-dimethyl-2,4-hexanedithiol, 2-ethyl-1,3-hexanedithiol, 3,5,5,-trimethyl-1,1-hexanedithiol, 1,7-heptanedithiol, 1,8-octanedithiol, 1,2-octanedithiol, 2,6-dimethyl-3,7-octanedithiol, 2,6-dimethyl-2,6-octanedithiol, 1,9-nonanedithiol, 1,10-decanedithiol, 1,12-dodecanedithiol, 1,2-diphenyl-1,2-ethanedithiol, 7,8-pentadecanedithiol, 1,10-octadecanedithiol, 1,12-octadecanedithiol, 1,2-hexadecanedithiol, 1,2-octadecanedithiol, 1,18-octadecanedithiol, 1,11-undecanedithiol, or 12,12-tricosanedithiol, and the pre-copolymer comprising cross-linked single source precursors;

decomposing the pre-copolymer of the at least two single source precursors in the presence of at least one thiol, the at least one thiol comprising at least one of 3-mercaptopropionic acid, a dialkyl dithiophosphoric acid, an alkane thiol, mercaptopropionic acid, mercaptoethanol, thioglycolic acid, thiol acetic acid, thiolactic acid, ammonium thioglycolate, mercaptoacetic acid, dithiothreitol, thiophenol, 2-mercapto-4-methyl-5-thiazoleacetic acid, 11-mercaptoundecanoic acid, 11-mercaptoundecylphosphoric acid, N—[(S)-3-mercapto-2-methylpropionyl]-L-proline, DL-penicillamine, N-acetyl-D-penicillamine, (2Z)-3-(4-iodophenyl)-2-mercapto-2-propenoic acid, (2-mercapto-1,3-thiazol-4-yl)acetic acid, 2-mercapto-3-(2-nitrophenyl)acrylic acid, 4-mercaptobenzoic acid, 3-mercaptobenzoic acid, or thiosalicylic acid; and forming a plurality of particles from one or more decomposition products of the pre-copolymer of the at least two single source precursors, the plurality of particles comprising a I-III-$VI_2$ material wherein I comprises at least one of copper or silver, III comprises at least one of aluminum, gallium, or indium, and VI comprises at least one of sulfur or selenium.

2. The method of claim 1, wherein decomposing the pre-copolymer of the at least two single source precursors in the presence of at least one thiol comprises exposing the pre-copolymer to microwave radiation in the presence of the at least one thiol.

3. The method of claim 1, wherein reacting at least two single source precursors with a dithiol to form a pre-copolymer of the at least two single source precursors comprises reacting the at least two single source precursors with the dithiol at a temperature of between about 60° C. and about 360° C. to form the pre-copolymer.

4. The method of claim 1, wherein reacting at least two single source precursors with a dithiol to form a pre-copolymer of the at least two single source precursors comprises reacting at least two single source precursors with 1,2-ethanedithiol to form the pre-copolymer.

5. The method of claim 1, wherein decomposing the pre-copolymer of the at least two single source precursors in the presence of at least one thiol comprises decomposing the pre-copolymer in the presence of 3-mercaptopropionic acid.

6. The method of claim 1, wherein decomposing the pre-copolymer of the at least two single source precursors in the presence of at least one thiol comprises exposing a reaction mixture comprising the pre-copolymer and the at least one thiol to microwave radiation to heat the reaction mixture to a temperature of at least 160° C.

7. The method of claim 1, wherein decomposing the pre-copolymer of the at least two single source precursors in the presence of at least one thiol comprises exposing a reaction mixture comprising the pre-copolymer and the at least one thiol to a temperature of at least 200° C. to form a mixture of particles in the chalcopyrite phase and the wurtzite phase.

8. The method of claim 1, wherein decomposing the pre-copolymer of the at least two single source precursors in the presence of at least one thiol comprises exposing a reaction mixture comprising the pre-copolymer and the at least one thiol to a temperature of at least 220° C. to form a plurality of particles in the wurtzite phase.

9. The method of claim 1, wherein reacting at least two single source precursors with a dithiol to form a pre-copolymer of the at least two single source precursors comprises reacting at least two of $(Ph_3P)_2Cu(\mu\text{-SEt})_2In(SEt)_2$, $(Ph_3P)_2CuIn(SePh)_2(SEt)_2$, or $(Ph_3P)_2Cu(\mu\text{-SEt})_2Ga(SEt)_2$ with the dithiol to form the pre-copolymer.

10. A device fabricated using the method of claim 1.

11. The method of claim 1, wherein reacting at least two single source precursors with a dithiol to form a pre-copolymer of the at least two single source precursors comprises reacting $(Ph_3P)_2Cu(\mu\text{-SEt})_2In(SEt)_2$ and $(Ph_3P)_2Cu(\mu\text{-SEt})_2Ga(SEt)_2$ with 1,2-ethanedithiol to form the pre-copolymer.

12. The method of claim 1, wherein reacting at least two single source precursors with a dithiol to form a pre-copolymer of the at least two single source precursors comprises reacting the at least two single source precursors with about one molar equivalent of the dithiol to form the pre-copolymer.

13. The method of claim 1, wherein reacting at least two single source precursors with a dithiol to form a pre-copolymer of the at least two single source precursors comprises reacting the at least two single source precursors with about one molar equivalent of 1,2-ethanedithiol to form the pre-copolymer.

14. The method of claim 13, wherein decomposing the pre-copolymer of the at least two single source precursors in the presence of at least one thiol comprises decomposing the pre-copolymer in the presence of an excess of 3-mercaptopropionic acid.

15. A method for forming particles, the method comprising:

decomposing at least two single source precursors in the presence of at least one thiol, the at least two single source precursors comprising at least two of a copper-indium single source precursor, a copper-gallium single source precursor a silver-indium single source precursor, a silver-gallium single source precursor, a copper-aluminum single source precursor, or a silver-aluminum single source precursor, the at least one thiol comprising at least one of 1,2-ethanedithiol, 1,1-methanedithiol, phenyl-1,2-ethanedithiol, 1,3-propanedithiol, 2,2-propanedithiol, 1,2-propanedithiol, 2,2-dimethyl-1,3-propanedithiol, 2-sec-butyl-2-methyl-1,3-propanedithiol, 1,3-diphenyl-2,2-propanedithiol, 1,4-butanedithiol, 2,3-butanedithiol, 2,2-butanedithiol, 1,3-isobutanedithiol, 1,5-pentanedithiol, 1,6-hexanedithiol, 1,2-hexanedithiol, 2-ethyl-1,6-hexanedithiol, 2,5-dimethyl-3,4-hexanedithiol, 2,5-dimethyl-2,4-hexanedithiol, 2-ethyl-1,3-hexanedithiol, 3,5,5,-trimethyl-1,1-hexanedithiol, 1,7-heptanedithiol, 1,8-octanedithiol, 1,2-octanedithiol, 2,6-dimethyl-3,7-octanedithiol, 2,6-dimethyl-2,6-octanedithiol, 1,9-nonanedithiol, 1,10-decanedithiol, 1,12-dodecanedithiol, 1,2-diphenyl-1,2-ethanedithiol, 7,8-pentadecanedithiol, 1,10-octadecanedithiol, 1,12-octadecanedithiol, 1,2-hexadecanedithiol, 1,2-octadecanedithiol, 1,18-octadecanedithiol, 1,11-undecanedithiol, 12,12-tricosanedithiol, 3-mercaptopropionic acid, a dialkyl dithiophosphoric acid, an alkane thiol, mercaptopropionic acid, mercaptoethanol, thioglycolic acid, thiol acetic acid, thiolactic acid, ammonium thioglycolate, mercaptoacetic acid, dithiothreitol, thiophenol, 2-mercapto-4-methyl-5-thiazoleacetic acid, 11-mercaptoundecanoic acid, 11-mercaptoundecylphosphoric acid, N—[(S)-3-mercapto-2-methylpropionyl]-L-proline, DL-penicillamine, N-acetyl-D-penicillamine, (2Z)-3-(4-iodophenyl)-2-mercapto-2-propenoic acid, (2-mercapto-1,3-thiazol-4-yl)acetic acid, 2-mercapto-3-(2-nitrophenyl)acrylic acid, 4-mercaptobenzoic acid, 3-mercaptobenzoic acid, or thiosalicylic acid, and the decomposing comprising:

dissolving the at least two single source precursors in a solvent to form a solution;

combining the solution with the at least one thiol to form a reaction mixture; and exposing the reaction mixture to microwave radiation to heat the reaction mixture to a temperature of at least 200° C.; and forming a plurality of particles from one or more decomposition products of the at least two single source precursors, the plurality of particles comprising a I-III-VI$_2$ material wherein I comprises at least one of copper or silver, III comprises at least one of aluminum, gallium, or indium, and VI comprises at least one of sulfur or selenium and comprising a mixture of particles in the chalcopyrite phase and the wurtzite phase.

* * * * *